United States Patent
Sano et al.

(10) Patent No.: US 12,023,761 B2
(45) Date of Patent: Jul. 2, 2024

(54) INSPECTION DEVICE AND INSPECTION METHOD

(71) Applicant: HAMAMATSU PHOTONICS K.K., Hamamatsu (JP)

(72) Inventors: Iku Sano, Hamamatsu (JP); Takeshi Sakamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/642,990

(22) PCT Filed: Sep. 16, 2020

(86) PCT No.: PCT/JP2020/035050
§ 371 (c)(1),
(2) Date: Mar. 15, 2022

(87) PCT Pub. No.: WO2021/054353
PCT Pub. Date: Mar. 25, 2021

(65) Prior Publication Data
US 2022/0331908 A1 Oct. 20, 2022

(30) Foreign Application Priority Data

Sep. 18, 2019 (JP) ................................. 2019-169468

(51) Int. Cl.
*B23K 26/53* (2014.01)
*B23K 26/03* (2006.01)

(52) U.S. Cl.
CPC ............ *B23K 26/53* (2015.10); *B23K 26/032* (2013.01)

(58) Field of Classification Search
None
See application file for complete search history.

(56) References Cited

U.S. PATENT DOCUMENTS 9,696,264 B2 * 7/2017 Lange et al. ........... G01N 21/88
2014/0300890 A1 10/2014 Lange et al.

FOREIGN PATENT DOCUMENTS

| CN | 1657220 A | 8/2005 |
| CN | 106536119 A | 3/2017 |

(Continued)

OTHER PUBLICATIONS

Machine translation of JP 2015012015 A performed on May 4, 2023, Okada (Year: 2015).*

(Continued)

*Primary Examiner* — Dana Ross
*Assistant Examiner* — Kevin Guanhua Wen
(74) *Attorney, Agent, or Firm* — Faegre Drinker Biddle & Reath LLP

(57) ABSTRACT

A laser processing device includes a stage; a laser irradiation unit; an image capturing unit; a control portion configured to execute controlling the laser irradiation unit such that one or a plurality of modified regions are formed inside the semiconductor substrate when the wafer is irradiated with the laser light, determining whether or not a crack extending from the modified region is in a crack reaching state where the crack has reached a front surface side of the semiconductor substrate on the basis of a signal output from the image capturing unit, and deriving information related to adjustment of irradiation conditions of the laser irradiation unit on the basis of determination results.

11 Claims, 29 Drawing Sheets

(56) References Cited

FOREIGN PATENT DOCUMENTS

| | | | | |
|---|---|---|---|---|
| CN | 107207318 A | | 9/2017 | |
| CN | 108365059 A | | 8/2018 | |
| JP | 2004532520 A | * | 10/2004 | ......... B23K 26/0624 |
| JP | 2006-179790 A | | 7/2006 | |
| JP | 2011-240644 A | | 12/2011 | |
| JP | 2015-012015 A | | 1/2015 | |
| JP | 2015012015 A | * | 1/2015 | ........... H01L 21/301 |
| JP | 2015-050226 A | | 3/2015 | |
| JP | 2015-170697 A | | 9/2015 | |
| JP | 2017-017290 A | | 1/2017 | |
| JP | 2017-064746 A | | 4/2017 | |
| JP | 2017-133997 A | | 8/2017 | |
| KR | 20150110466 A | * | 10/2015 | ......... B23K 26/0643 |
| WO | WO-2010/116917 A1 | | 10/2010 | |
| WO | WO 2010116917 A1 | * | 10/2010 | ........... H01L 21/304 |
| WO | WO-2014/119114 A1 | | 8/2014 | |
| WO | WO 2014147048 A2 | * | 9/2014 | ......... C03B 33/0222 |
| WO | WO 2016081548 A1 | * | 5/2016 | ............. C03B 33/09 |

OTHER PUBLICATIONS

Machine translation of KR 20150110466 A performed on May 4, 2023, Hirose et al. (Year: 2015).*
Machine translation of JP 2004532520 A performed on May 4, 2023, Airman et al. (Year: 2004).*
Machine translation of WO 2010116917 A1 performed on May 4, 2023, Sugiura (Year: 2010).*
Machine translation of WO 2014147048 A2 performed on May 5, 2023, Boehme (Year: 2014).*
International Preliminary Report on Patentability dated Mar. 31, 2022 for PCT/JP2020/035050.

* cited by examiner

Fig.15

| MEASUREMENT POINT | Z167 | Z170 | Z171 | Z172 | Z173 | Z174 | Z175 | Z176 | Z177 | Z178 |
|---|---|---|---|---|---|---|---|---|---|---|
| a: TIP OF UPPER CRACK | 233 | 223 | 213 | 250 | 246 | 232 | 225 | 217 | 199 | 199 |
| b: UPPER END OF SD2 | 195 | 185 | 174 | 175 | 171 | 168 | 168 | 161 | 158 | 162 |
| d: UPPER END OF SD1 | 113 | 106 | 99 | 95 | 92 | 92 | 89 | 82 | 74 | 75 |
| f: TIP OF LOWER CRACK | 52 | 36 | 33 | | | | | | | |
| e: LOWER END OF SD1 (DZ RATE) | 90 | 78 | 73 | 69 | 65 | 61 | 57 | 53 | 49 | 45 |
| e': UPPER END OF SD1 (DZ RATE) | 112 | 100 | 95 | 91 | 87 | 83 | 79 | 75 | 71 | 67 |
| c: LOWER END OF SD2 (DZ RATE) | 164 | 152 | 148 | 144 | 140 | 135 | 131 | 127 | 123 | 119 |
| c': UPPER END OF SD2 (DZ RATE) | 186 | 174 | 170 | 166 | 162 | 157 | 153 | 149 | 145 | 141 |
| a-b | 38 | 38 | 39 | 75 | 75 | 64 | 57 | 56 | 41 | 37 |
| a-e | 143 | 145 | 139 | 181 | 181 | 171 | 168 | 164 | 150 | 154 |
| OBSERVATION RESULTS | ST | ST | ST | BHC | BHC | BHC | BHC | BHC | BHC | BHC |

Fig.22

| SETTING SCREEN | | |
|---|---|---|
| INSPECTION CONDITIONS | SELECT CONDITIONS | ▽ |
| WAFER THICKNESS | SELECT THICKNESS | ▽ |
| TARGET ZH | AUTOMATIC DISPLAY | |
| TARGET LENGTH OF LOWER END CRACK | AUTOMATIC DISPLAY | |
| FLOW OF BHC INSPECTION AND ADJUSTMENT | SELECT FLOW | ▽ |
| METHOD OF DETERMINING BHC | SELECT METHOD | ▽ |
| METHOD OF DETERMINING PASS OR FAIL | SELECT METHOD | ▽ |

SETTING SCREEN

CONDITION 1: t775 μm, TWO FOCAL POINTS,
BHC INSPECTION

| NUMBER OF FOCAL POINTS | TWO FOCAL POINTS ▽ |
|---|---|
| NUMBER OF PASSES | 1pass ▽ |
| PROCESSING SPEED | 800mm/sec ▽ |
| PULSE WIDTH | 700nsec ▽ |
| FREQUENCY | 120kHz ▽ |
| ZH | VARIABLE WITHIN ZH178 TO 167 ▽ |
| PROCESSING OUTPUT | 2.7w ▽ |

| TARGET LENGTH OF LOWER END CRACK | 65μm ▽ |
|---|---|
| STANDARD | ±5μm ▽ |
| TARGET ZH | Z175 ▽ |
| STANDARD | ±Z1 ▽ |

| INSPECTION CONDITIONS | CONDITION 1: t775 μm, TWO FOCAL POINTS, BHC INSPECTION | | |
|---|---|---|---|
| INSPECTION WAFER THICKNESS | t775μm | DETERMINATION OF PASS OR FAIL | PASS |
| TARGET LENGTH OF LOWER END CRACK | 65μm | LENGTH OF LOWER END CRACK OF SHALLOWEST BHC | OUTWARD WAY 70μm INWARD WAY 66μm PASS |
| STANDARD | ±5μm | ZH OF SHALLOWEST BHC | OUTWARD WAY ZH172 INWARD WAY ZH173 PASS |
| TARGET ZH | ZH173 | | |
| STANDARD | ±Z1 | | |
| ADJUSTMENT OF CORRECTION PARAMETERS | ABSENT OR PRESENT ▽ | | |

PHOTOGRAPH OF TIP OF SD2 CRACK IN SHALLOWEST BHC LINE

| OUTWARD WAY Z172 | INWARD WAY Z173 |
|---|---|

LIST OF BHC MARGIN INSPECTION RESULTS

| ZH | OUTWARD WAY | | | | INWARD WAY | | | |
|---|---|---|---|---|---|---|---|---|
| | REAR SURFACE STATE | POSITION OF SD2 UPPER END CRACK | AMOUNT OF CHANGE | POSITION OF SD1 LOWER END | REAR SURFACE STATE | POSITION OF SD2 UPPER END CRACK | AMOUNT OF CHANGE | POSITION OF SD1 LOWER END |
| 170 | ST | 223 | - | - | ST | 230 | - | - |
| 171 | ST | 212 | 11 | - | ST | 223 | 7 | - |
| 172 | BHC | 250 | 38 | - | ST | 208 | 15 | - |
| 173 | | | - | 70 | BHC | 246 | 38 | 66 |

| INSPECTION CONDITIONS | CONDITION t:775 μm, TWO FOCAL POINTS, BHC INSPECTION | | |
|---|---|---|---|
| INSPECTION WAFER THICKNESS | t771μm | DETERMINATION OF PASS OR FAIL | FAIL |
| TARGET LENGTH OF LOWER END CRACK | 65μm | LENGTH OF LOWER END CRACK OF SHALLOWEST BHC | OUTWARD WAY 62μm INWARD WAY 58μm |
| STANDARD | ±5μm | ZH OF SHALLOWEST BHC | OUTWARD WAY ZH173 INWARD WAY ZH174 | FAIL |
| TARGET ZH | ZH172 | | |
| STANDARD | ±Z1 | | |
| ADJUSTMENT OF CORRECTION PARAMETERS | ABSENT OR PRESENT ▽ | | |

PHOTOGRAPH OF TIP OF SD1 LOWER END CRACK IN DEEPEST ST LINE

| OUTWARD WAY Z174 | INWARD WAY Z174 |

LIST OF BHC MARGIN INSPECTION RESULTS

| ZH | OUTWARD WAY | | INWARD WAY | |
| | REAR SURFACE STATE | TIP OF LOWER END CRACK | REAR SURFACE STATE | TIP OF LOWER END CRACK |
|---|---|---|---|---|
| 170 | ST | PRESENT | ST | PRESENT |
| 171 | ST | PRESENT | ST | PRESENT |
| 172 | ST | PRESENT | ST | PRESENT |
| 173 | BHC | ABSENT | ST | PRESENT |
| 174 | BHC | ABSENT | BHC | ABSENT |

WISH TO PERFORM ENGINE ADJUSTMENT WITH CORRECTION PARAMETERS?  YES   NO

150

INSPECTION DEVICE AND INSPECTION METHOD

TECHNICAL FIELD

An aspect of the present invention relates to an inspection device and an inspection method.

BACKGROUND ART

In order to cut a wafer, which includes a semiconductor substrate and a functional element layer formed on a front surface of the semiconductor substrate, along each of a plurality of lines, a laser processing device for forming a plurality of rows of modified regions inside the semiconductor substrate along each of the plurality of lines by irradiating the wafer with laser light from a rear surface side of the semiconductor substrate is known. The laser processing device described in Patent Literature 1 includes an infrared camera so that modified regions formed inside a semiconductor substrate, processing damage formed in a functional element layer, or the like can be observed from a rear surface side of the semiconductor substrate.

CITATION LIST

Patent Literature

[Patent Literature 1] Japanese Unexamined Patent Publication No. 2017-64746

SUMMARY OF INVENTION

Technical Problem

In such a laser processing device described above, a wafer may be irradiated with laser light from a rear surface side of a semiconductor substrate on condition that a crack is formed across a plurality of rows of modified regions. In such a case, for example, due to a problem or the like in the laser processing device, a length of a crack across a plurality of rows of modified regions sometimes does not become a desired length. For example, when the length of a crack which inherently should have reached a front surface side of a semiconductor substrate has not reached the front surface side of the semiconductor substrate, there is concern that a wafer may not be able to be reliably cut along each of a plurality of lines in a succeeding step.

An object of an aspect of the present invention is to provide an inspection device and an inspection method, in which a length of a crack across modified regions can become a desired length.

Solution to Problem

An inspection device according to an aspect of the present invention includes a stage configured to support a wafer having a semiconductor substrate having a first front surface and a second front surface; a laser irradiation portion configured to irradiate the wafer with laser light; an image capturing portion configured to output light able to penetrate the semiconductor substrate and detect the light propagated through the semiconductor substrate; and a control portion configured to execute controlling the laser irradiation portion such that one or a plurality of modified regions are formed inside the semiconductor substrate when the wafer is irradiated with the laser light, determining whether or not a crack reaching state where a crack extending from the modified region has reached the first front surface side of the semiconductor substrate has been realized on the basis of a signal output from the image capturing portion having detected the light, and deriving information related to adjustment of irradiation conditions of the laser irradiation portion on the basis of determination results.

In this inspection device, the wafer is irradiated with laser light such that a modified region is formed inside the semiconductor substrate, an image of light output to the semiconductor substrate and able to penetrate therethrough is captured, and it is determined whether or not the crack reaching state where a crack extending from the modified region has reached the first front surface side of the semiconductor substrate has been realized on the basis of image capturing results (a signal output from the image capturing portion). Here, for example, it is conceivable that although a modified region is formed at a position where the crack reaching state should inherently be realized (in a state where there is no problem or the like in the inspection device), it may be determined that the crack reaching state has not been realized (the length of a crack is shorter than the inherent length), or although a modified region is formed at a position where the crack reaching state should not be realized, it may be determined that the crack reaching state has been realized (the length of a crack is longer than the inherent length). In this inspection device, in consideration of such determination results, information related to adjustment of the irradiation conditions of the laser irradiation portion is derived. For this reason, in this inspection device, for example, in consideration of the determination results, information for adjustment of the irradiation conditions can be derived such that the length of a crack is lengthened when the length of the crack is shorter than the inherent length and such that the length of a crack is shortened when the length of the crack is longer than the inherent length. Further, the length of a crack can become a desired length by adjusting the irradiation conditions using information for adjustment of the irradiation conditions which has been derived in this manner. As above, according to this inspection device, the length of a crack across modified regions can become a desired length.

The control portion may estimate a length of the crack on the basis of the determination results and may derive information related to adjustment of the irradiation conditions on the basis of the estimated length of the crack. When information related to adjustment of the irradiation conditions is derived on the basis of the estimated length of the crack, adjustment accuracy of the irradiation conditions is improved, and the length of a crack can become a desired length with higher accuracy.

The inspection device may further include an input portion configured to receive an input of inspection conditions including at least information related to a thickness of the wafer, and an output portion configured to output a pass or a fail for inspection based on the determination results. The control portion may compare a crack length target value, a target value for the crack length set in accordance with the inspection conditions, to the estimated length of the crack, and when it is decided that adjustment of the irradiation conditions is required, the control portion may decide a fail for the inspection. In this manner, when the crack length target value is derived on the basis of information related to the thickness of the wafer input from a user and a necessity or non-necessity for adjustment of the irradiation conditions (a pass or a fail for inspection) is decided, the length of a crack can be more suitably adjusted in consideration of the inspection conditions (information related to the thickness of the wafer). In addition, when a pass or a fail for inspection is output, a user can be informed of the state of a laser processing device including the length of a crack.

The output portion may output inquiry information for inquiring regarding whether or not to perform adjustment of the irradiation conditions in the case of a fail for the inspection. The input portion may receive an input of a user's request, a request of a user responding to the inquiry information. The control portion may derive information related to adjustment of the irradiation conditions when the user has requested in the user's request that adjustment of the irradiation conditions be performed. Accordingly, the length of a crack can be adjusted reflecting a demand of a user.

The output portion may output information related to the adjustment derived by the control portion. In this case, on the basis of the output information related to adjustment, for example, the irradiation conditions can be adjusted while being manually checked by a user, and the length of a crack can become a desired length.

The control portion may adjust the irradiation conditions on the basis of the derived information related to the adjustment. In this case, since the irradiation conditions are automatically adjusted, the length of a crack can become a desired length more simply and promptly.

The control portion may control the laser irradiation portion such that the modified region having a formation depth different from formation depths of other lines included in a plurality of lines is formed along each of the plurality of lines in the wafer, and may derive a difference between a position of a tip of an upper crack on the second front surface side, which is a crack extending from the modified region to the second front surface side of the semiconductor substrate, and a position where the modified region is formed in order from a line having a shallowest formation depth of the modified region or in order from a line having a deepest formation depth of the modified region, and determine whether or not the crack reaching state has been realized on the basis of an amount of change in the difference. If the difference between the position of the tip of the upper crack on the second front surface side and the position where the modified region is formed is derived in order from a line having a shallowest formation depth of the modified region or in order from a line having a deepest formation depth thereof, the amount of change in the difference described above from the immediately preceding line becomes large in a line changing between the crack reaching state and a state where a crack has not reached the first front surface side of the semiconductor substrate. For this reason, it is possible to determine with high accuracy whether or not the crack reaching state has been realized by determining whether or not the crack reaching state has been realized on the basis of the amount of change in the difference described above.

The control portion may control the laser irradiation portion such that the modified region having a formation depth different from formation depths of other lines included in a plurality of lines is formed along each of the plurality of lines in the wafer, and may derive a position of a tip of an upper crack on the second front surface side, which is a crack extending from the modified region to the second front surface side of the semiconductor substrate, in order from a line having a shallowest formation depth of the modified region or in order from a line having a deepest formation depth of the modified region, and determine whether or not the crack reaching state has been realized on the basis of an amount of change in the position of the tip. If the position of the tip of the upper crack on the second front surface side is derived in order from a line having a shallowest formation depth of the modified region or in order from a line having a deepest formation depth thereof, the amount of change in the position of the tip described above from the immediately preceding line becomes large in a line changing between the crack reaching state and a state where a crack has not reached the first front surface side of the semiconductor substrate. For this reason, it is possible to determine with high accuracy whether or not the crack reaching state has been realized by determining whether or not the crack reaching state has been realized on the basis of the amount of change in the position of the tip described above.

The control portion may determine whether or not the crack reaching state has been realized on the basis of the presence or absence of a tip of a lower crack on the first front surface side, which is a crack extending from the modified region to the first front surface side of the semiconductor substrate. When the presence of the tip of the lower crack on the first front surface side is confirmed, it is assumed that the crack is not in the crack reaching state. For this reason, it is possible to determine with high accuracy whether or not the crack reaching state has been realized by determining whether or not the crack reaching state has been realized on the basis of the presence or absence of the tip of the lower crack on the first front surface side.

The control portion may control the laser irradiation portion such that the modified region is formed at a predetermined first formation depth having been estimated to be in the crack reaching state in advance, and when it is determined that a crack extending from the modified region is not in the crack reaching state, the control portion may derive information related to adjustment of the irradiation conditions such that a length of the crack is lengthened. In this manner, when information related to adjustment of the irradiation conditions is derived such that the length of a crack is lengthened when the modified region has been formed at a formation depth having been estimated to be in the crack reaching state and the crack reaching state has not been realized, inspection can be promptly performed with minimum necessary formation or the like of the modified region related to inspection.

The control portion may control the laser irradiation portion such that the modified region is formed at a predetermined second formation depth having been estimated not to be in the crack reaching state when it is determined that the modified region has been formed at the first formation depth and the crack reaching state has been realized in a state where adjustment of the irradiation conditions has not been performed, and the control portion may derive information related to adjustment of the irradiation conditions such that a length of the crack is shortened when it is determined that the crack reaching state has been realized. When it is determined that the crack reaching state has been realized at the first formation depth without performing adjustment of the irradiation conditions even once, although it is guaranteed that the length of the crack is sufficiently long when a modified region is formed at a depth at which the crack reaching state should have been realized (the first formation depth), it is not guaranteed that the length of the crack is not excessively long (not longer than a desired length of the crack). In this regard, when the crack reaching state has been realized at the first formation depth, it is determined whether or not the modified region has been formed at the second formation depth having been estimated not to be in the crack reaching state and the crack reaching state has not been realized, and when the crack reaching state has been realized, information related to adjustment of the irradiation conditions is derived such that the length of a crack is shortened. Therefore, when the length of a crack has become longer than a desired length, the length of the crack can be suitably shortened (to a desired length).

An inspection method according to another aspect of the present invention includes a first step of preparing a wafer including a semiconductor substrate having a first front surface and a second front surface and forming one or a plurality of rows of modified regions inside the semiconductor substrate by irradiating the wafer with laser light, a second step of outputting light able to penetrate the semiconductor substrate having the modified region formed therein by the first step and detecting the light propagated through the semiconductor substrate, a third step of determining whether or not a crack reaching state where a crack extending from the modified region has reached the first front surface side of the semiconductor substrate has been realized on the basis of the light detected in the second step, and a fourth step of deriving information related to adjustment of irradiation conditions of the laser light on the basis of determination results in the third step.

Advantageous Effects of Invention

According to the aspects of the present invention, it is possible to provide an inspection device and an inspection method, in which a length of a crack across modified regions can become a desired length.

BRIEF DESCRIPTION OF DRAWINGS

FIG. 15 is a table showing an example of image capturing results at respective measurement points.
FIG. 22 is an example of an image for setting inspection conditions.
FIG. 23 is an example of an image for setting inspection conditions.
FIG. 24 is an example of an image of a passed inspection.
FIG. 27 is an example of an image of a failed inspection.
FIG. 29 is an example of an image of a failed inspection.

DESCRIPTION OF EMBODIMENT

Hereinafter, an embodiment of the present invention will be described in detail with reference to the drawings. In each of the diagrams, the same reference signs are applied to parts which are the same or corresponding, and duplicate description thereof will be omitted.

[Constitution of Laser Processing Device]

Figure 1:
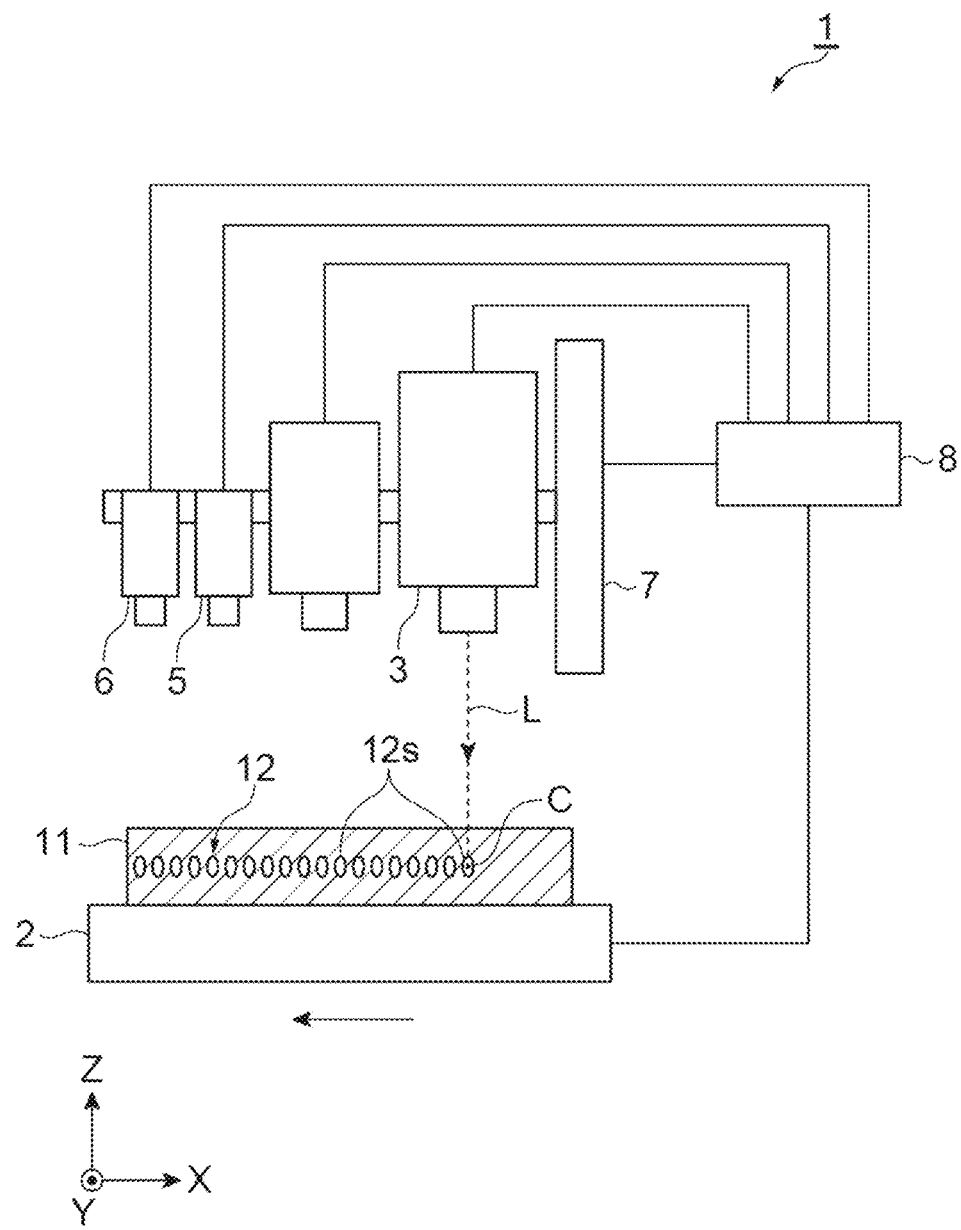
FIG. 1 is a view of a constitution of a laser processing device including an inspection device of an embodiment.

As illustrated in FIG. 1, a laser processing device 1 (inspection device) includes a stage 2, a laser irradiation unit 3, a plurality of image capturing units 4, 5, and 6, a drive unit 7, and a control portion 8. The laser processing device 1 is a device for forming a modified region 12 in a target 11 by irradiating the target 11 with laser light L.

For example, the stage 2 supports the target 11 by adsorbing a film attached to the target 11. The stage 2 can move in each of an X direction and a Y direction and can rotate about an axis parallel to a Z direction as a centerline. The X direction and the Y direction are a first horizontal direction and a second horizontal direction perpendicular to each other, and the Z direction is a vertical direction.

The laser irradiation unit 3 condenses the laser light L able to penetrate the target 11 and irradiates the target 11 with the light. If the laser light L is condensed inside the target 11 supported by the stage 2, the laser light L is particularly absorbed at a part corresponding to a light condensing point C of the laser light L, and the modified region 12 is formed inside the target 11.

The modified region 12 is a region of which a density, a refraction index, a mechanical strength, and other physical characteristics are different from those of peripheral non-modified regions. Examples of the modified region 12 include a melting processing region, a crack region, a dielectric breakdown region, and a refraction index change region. The modified region 12 has characteristics such that a crack is likely to extend from the modified region 12 to an incident side of the laser light L and a side opposite thereto. Such characteristics of the modified region 12 are utilized for cutting the target 11.

As an example, if the stage 2 is moved in the X direction and the light condensing point C is relatively moved in the X direction with respect to the target 11, a plurality of modified spots 12s are formed side by side in a row in the X direction. One modified spot 12s is formed through irradiation of one pulse of the laser light L. One row of the modified region 12 is an aggregation of a plurality of modified spots 12s arranged in one row. Adjacent modified spots 12s may be connected to each other or may be separated from each other due to a relative movement speed of the light condensing point C with respect to the target 11 and a repetition frequency of the laser light L.

The image capturing unit 4 captures images of the modified region 12 formed in the target 11 and a tip of a crack extending from the modified region 12.

The image capturing unit 5 and the image capturing unit 6 capture images of the target 11 supported by the stage 2 using light penetrating the target 11 under control of the control portion 8. Images obtained through image capturing of the image capturing units 5 and 6 are used for alignment of an irradiation position of the laser light L, as an example.

The drive unit 7 supports the laser irradiation unit 3 and the plurality of image capturing units 4, 5, and 6. The drive unit 7 moves the laser irradiation unit 3 and the plurality of image capturing units 4, 5, and 6 in the Z direction.

The control portion 8 controls operation of the stage 2, the laser irradiation unit 3, the plurality of image capturing units 4, 5, and 6, and the drive unit 7. The control portion 8 is constituted as a computer device including a processor, a memory, a storage, a communication device, and the like. In the control portion 8, the processor executes software (program) which has been read by the memory or the like and controls reading and writing of data in the memory and the storage and communication by the communication device.

[Constitution of Target]

Figure 2:
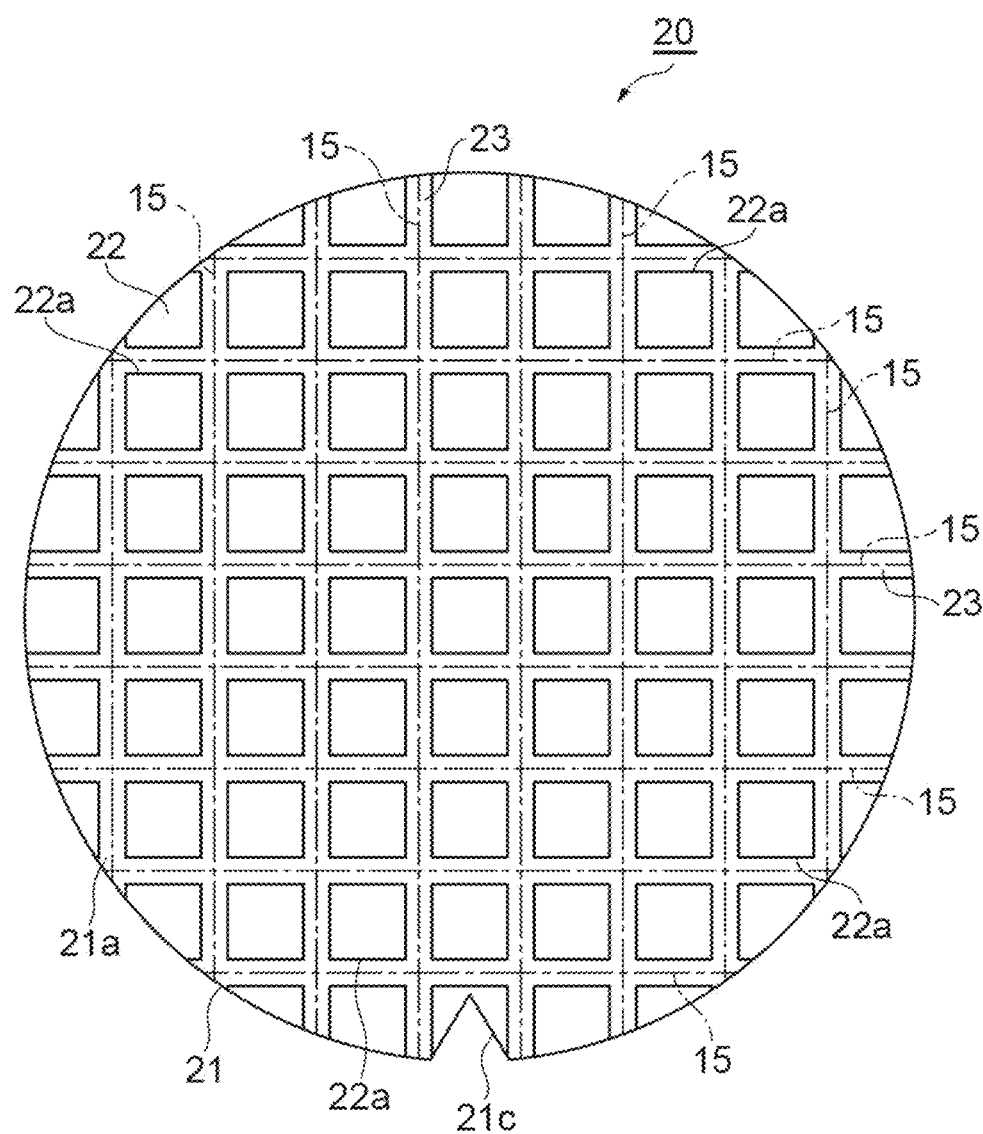
FIG. 2 is a plan view of a wafer of the embodiment.
Figure 3:
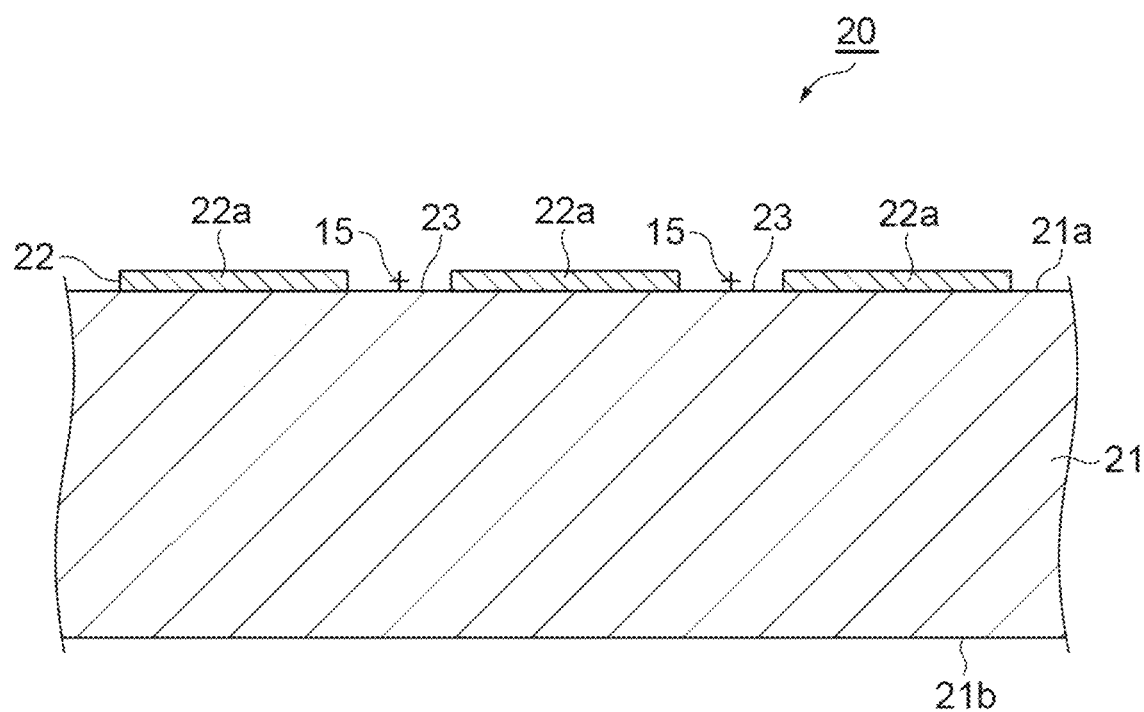
FIG. 3 is a cross-sectional view of a part of the wafer illustrated in FIG. 2.

As illustrated in FIGS. 2 and 3, the target 11 of the present embodiment is a wafer 20. The wafer 20 includes a semiconductor substrate 21 and a functional element layer 22. In the present embodiment, the wafer 20 is described such that it has the functional element layer 22. However, the wafer 20 may have or may not have the functional element layer 22 and may be a bare wafer. The semiconductor substrate 21 has a front surface 21a (a first front surface, a laser irradiation rear surface) and a rear surface 21b (a second front surface, a laser irradiation surface). For example, the semiconductor substrate 21 is a silicon substrate. The functional element layer 22 is formed on the front surface 21a of the semiconductor substrate 21. The functional element layer 22 includes a plurality of functional elements 22a which are two-dimensionally arrayed along the front surface 21a. Examples of the functional elements 22a include a light receiving element of a photodiode and the like, a light emitting element of a laser diode and the like, and a circuit element of a memory and the like. The functional elements 22a may have a three-dimensional constitution in which a plurality of layers are stacked. A notch 21c indicating a crystal orientation is provided in the semiconductor substrate 21, but an orientation flat may be provided therein in place of the notch 21c.

The wafer 20 is cut for each of the functional elements 22a along each of a plurality of lines 15. The plurality of lines 15 pass through respective areas between the plurality of functional elements 22a when viewed in a thickness direction of the wafer 20. More specifically, each of the lines 15 passes through the center of a street region 23 (the center in a width direction) when viewed in the thickness direction of the wafer 20. The street region 23 extends such that it passes through an area between adjacent functional elements 22a in the functional element layer 22. In the present embodiment, the plurality of functional elements 22a are arrayed in a matrix shape along the front surface 21a, and the plurality of lines 15 are set in a lattice shape. The lines 15 are imaginary lines, but they may be lines which are actually drawn.

[Constitution of Laser Irradiation Unit]

Figure 4:
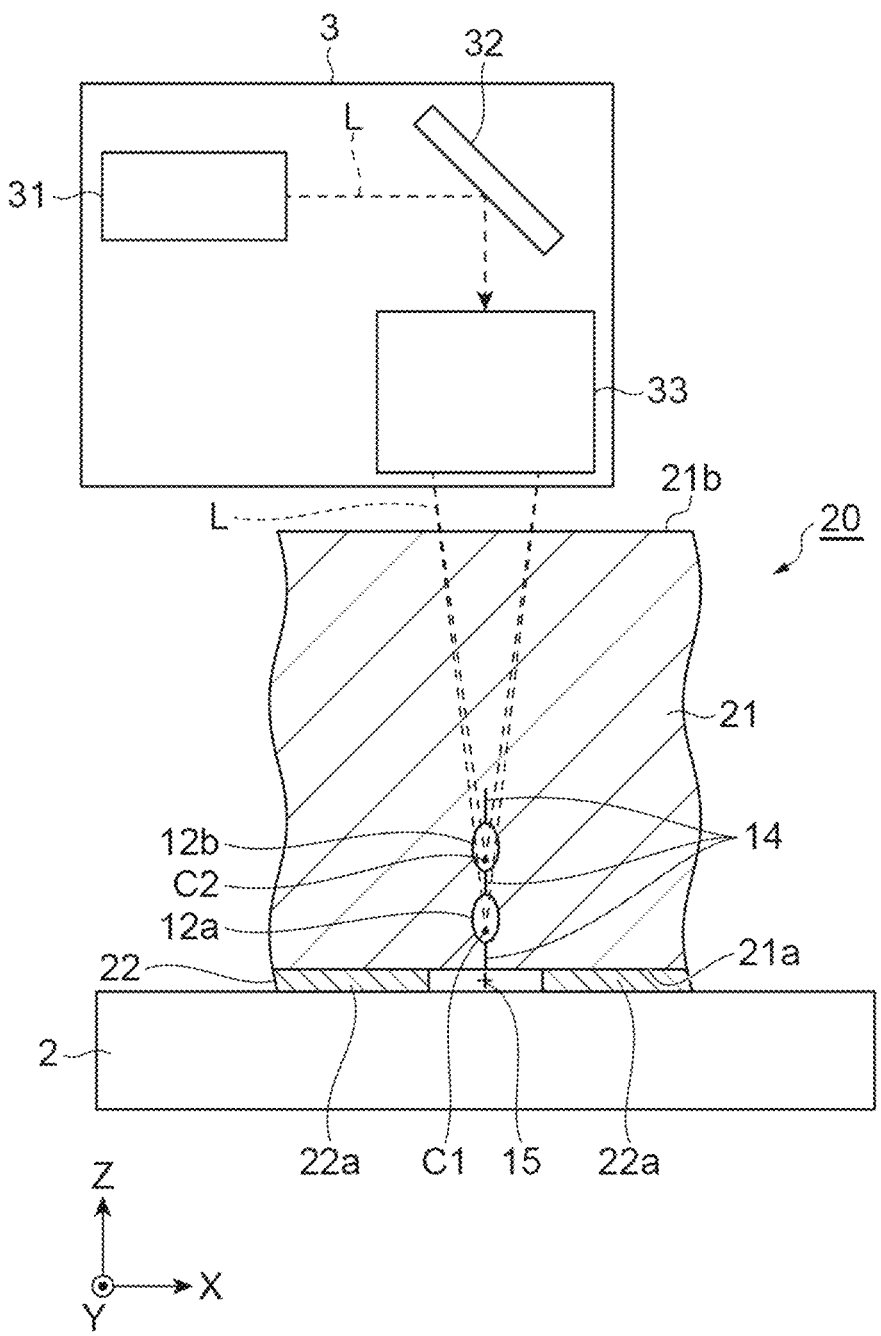
FIG. 4 is a view of a constitution of a laser irradiation unit illustrated in FIG. 1.

As illustrated in FIG. 4, the laser irradiation unit 3 has a light source 31, a spatial light modulator 32, and a light condensing lens 33. For example, the light source 31 outputs the laser light L by a pulse oscillation method. The spatial light modulator 32 modulates the laser light L output from the light source 31. For example, the spatial light modulator 32 is a spatial light modulator (SLM) of liquid crystal on silicon (LCOS). The light condensing lens 33 condenses the laser light L modulated by the spatial light modulator 32.

In the present embodiment, the laser irradiation unit 3 forms two rows of modified regions 12a and 12b inside the semiconductor substrate 21 along each of the plurality of lines 15 by irradiating the wafer 20 with the laser light L from the rear surface 21b side of the semiconductor substrate 21 along each of the plurality of lines 15. The modified region (first modified region) 12a is a modified region, of the two rows of the modified regions 12a and 12b, closest to the front surface 21a. The modified region (second modified region) 12b is a modified region, of the two rows of the modified regions 12a and 12b, closest to the modified region 12a, and is a modified region closest to the rear surface 21b.

The two rows of the modified regions 12a and 12b are adjacent to each other in the thickness direction of the wafer 20 (Z direction). The two rows of the modified regions 12a and 12b are formed when two light condensing points C1 and C2 are relatively moved along the lines 15 with respect to the semiconductor substrate 21. For example, the laser light L is modulated by the spatial light modulator 32 such that the light condensing point C2 is positioned on a rear side in a forward movement direction and the incident side of the laser light L with respect to the light condensing point C1. Regarding formation of a modified region, a single focal point or a multi-focal point may be adopted, and one pass or a plurality of passes may be adopted.

On condition that a crack 14 across the two rows of the modified regions 12a and 12b reaches the front surface 21a of the semiconductor substrate 21, the laser irradiation unit 3 irradiates the wafer 20 with the laser light L from the rear surface 21b side of the semiconductor substrate 21 along each of the plurality of lines 15. As an example, the two light condensing points C1 and C2 are respectively focused on a position of 54 μm and a position of 128 μm from the front surface 21a with respect to the semiconductor substrate 21 that is a single-crystal silicon substrate having a thickness of 775 μm, and the wafer 20 is irradiated with the laser light L from the rear surface 21b side of the semiconductor substrate 21 along each of the plurality of lines 15. At this time, the laser light L has a wavelength of 1,099 nm, a pulse width of 700 ns, and a repetition frequency of 120 kHz. In addition, the output of the laser light L at the light condensing point C1 is 2.7 W, and the output of the laser light L at the light condensing point C2 is 2.7 W. The relative movement speed of the two light condensing points C1 and C2 with respect to the semiconductor substrate 21 is 800 mm/s.

Formation of such two rows of the modified regions 12a and 12b and the crack 14 is performed in the following case. That is, in a succeeding step, the semiconductor substrate 21 is thinned and the crack 14 is exposed on the rear surface 21b by grinding the rear surface 21b of the semiconductor substrate 21, and the wafer 20 is cut into a plurality of semiconductor devices along each of the plurality of lines 15.

[Constitution of Image Capturing Unit for Inspection]

Figure 5:
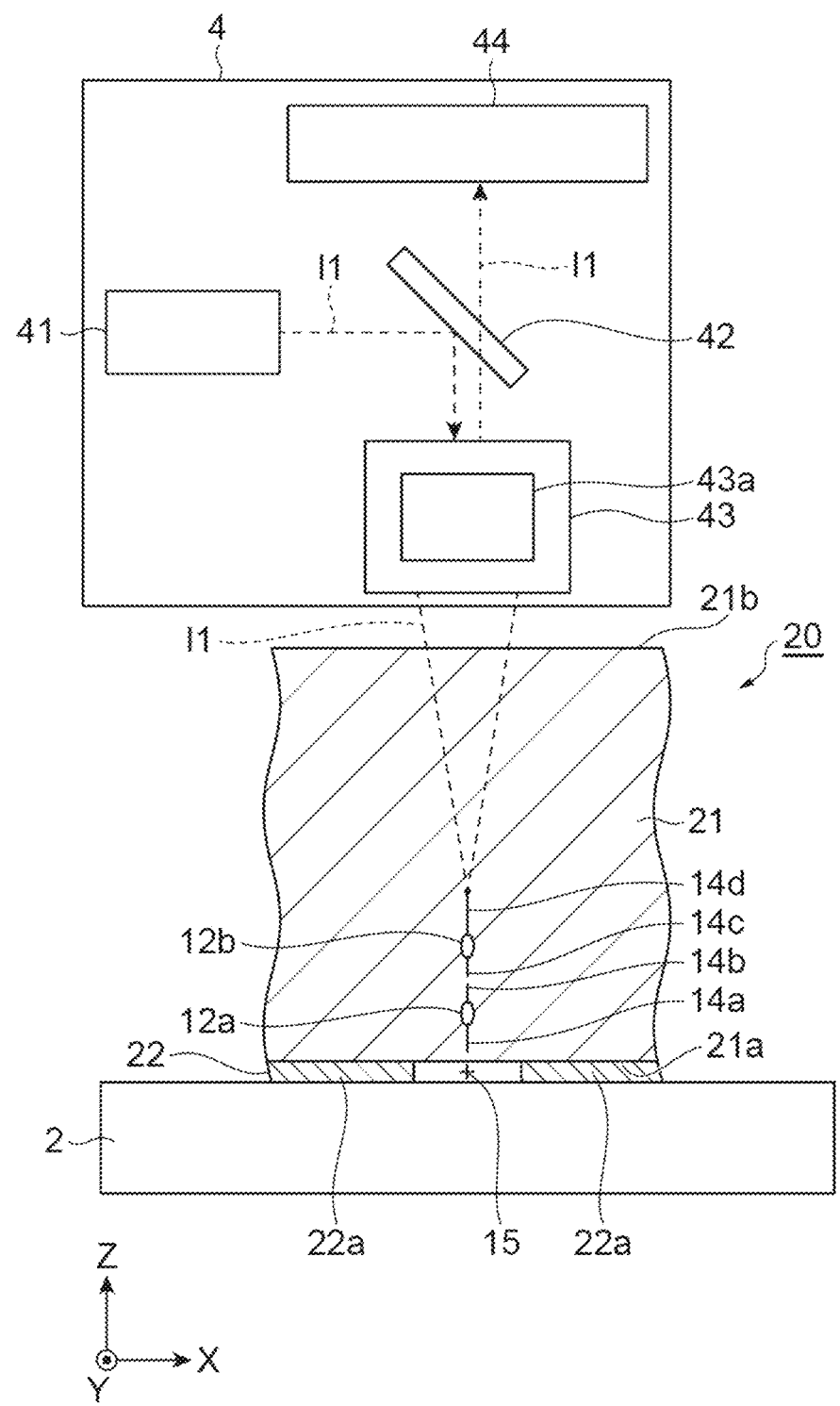
FIG. 5 is a view of a constitution of an image capturing unit for inspection illustrated in FIG. 1.

As illustrated in FIG. 5, the image capturing unit 4 has a light source 41, a mirror 42, an object lens 43, and a light detection portion 44. The light source 41 outputs light I1 able to penetrate the semiconductor substrate 21. For example, the light source 41 is constituted of a halogen lamp and a filter and outputs the light I1 of a near infrared region. The light I1 output from the light source 41 is reflected by the mirror 42 and passes through the object lens 43, and the wafer 20 is irradiated therewith from the rear surface 21b side of the semiconductor substrate 21. At this time, the stage 2 supports the wafer 20 in which the two rows of the modified regions 12a and 12b are formed as described above.

The object lens 43 allows the light I1 reflected by the front surface 21a of the semiconductor substrate 21 to pass through. Namely, the object lens 43 allows the light I1 propagated through the semiconductor substrate 21 to pass through. The number of apertures (NA) of the object lens 43 is 0.45 or more. The object lens 43 has a correction ring 43a. For example, the correction ring 43a corrects an aberration occurring in the light I1 inside the semiconductor substrate 21 by adjusting a distance between a plurality of lenses constituting the object lens 43. The light detection portion 44 detects the light I1 which has penetrated the object lens 43 and the mirror 42. For example, the light detection portion 44 is constituted of an InGaAs camera and detects the light I1 of a near infrared region.

The image capturing unit 4 can capture an image of a tip of each of the two rows of the modified regions 12a and 12b and each of a plurality of cracks 14a, 14b, 14c, and 14d (details will be described below). The crack 14a is a crack extending from the modified region 12a to the front surface 21a side. The crack 14b is a crack extending from the modified region 12a to the rear surface 21b side. The crack 14c is a crack extending from the modified region 12b to the front surface 21a side. The crack 14d is a crack extending from the modified region 12b to the rear surface 21b side. The control portion 8 irradiates the laser irradiation unit 3 with the laser light L on condition that the crack 14 across the two rows of the modified regions 12a and 12b reaches the front surface 21a of the semiconductor substrate 21 (refer to FIG. 4). However, if the crack 14 does not reach the front surface 21a due to some kind of a problem or the like, such a plurality of cracks 14a, 14b, 14c, and 14d are formed. In the present embodiment, regarding preprocessing of processing in which the laser irradiation unit 3 performs irradiation with the laser light L so as to cut the wafer 20 into a plurality of semiconductor devices or the like, processing in which the length of a crack is inspected in order to cope with a problem or the like as described above and the length of the crack is adjusted in accordance with inspection results. Specifically, regarding the preprocessing described above, processing in which modified regions for inspection are formed in the wafer 20, the length of a crack extending from the modified regions is determined, and the length of the crack is adjusted in accordance with the length of the crack (details will be described below).

[Constitution of Image Capturing Unit for Alignment Correction]

Figure 6:
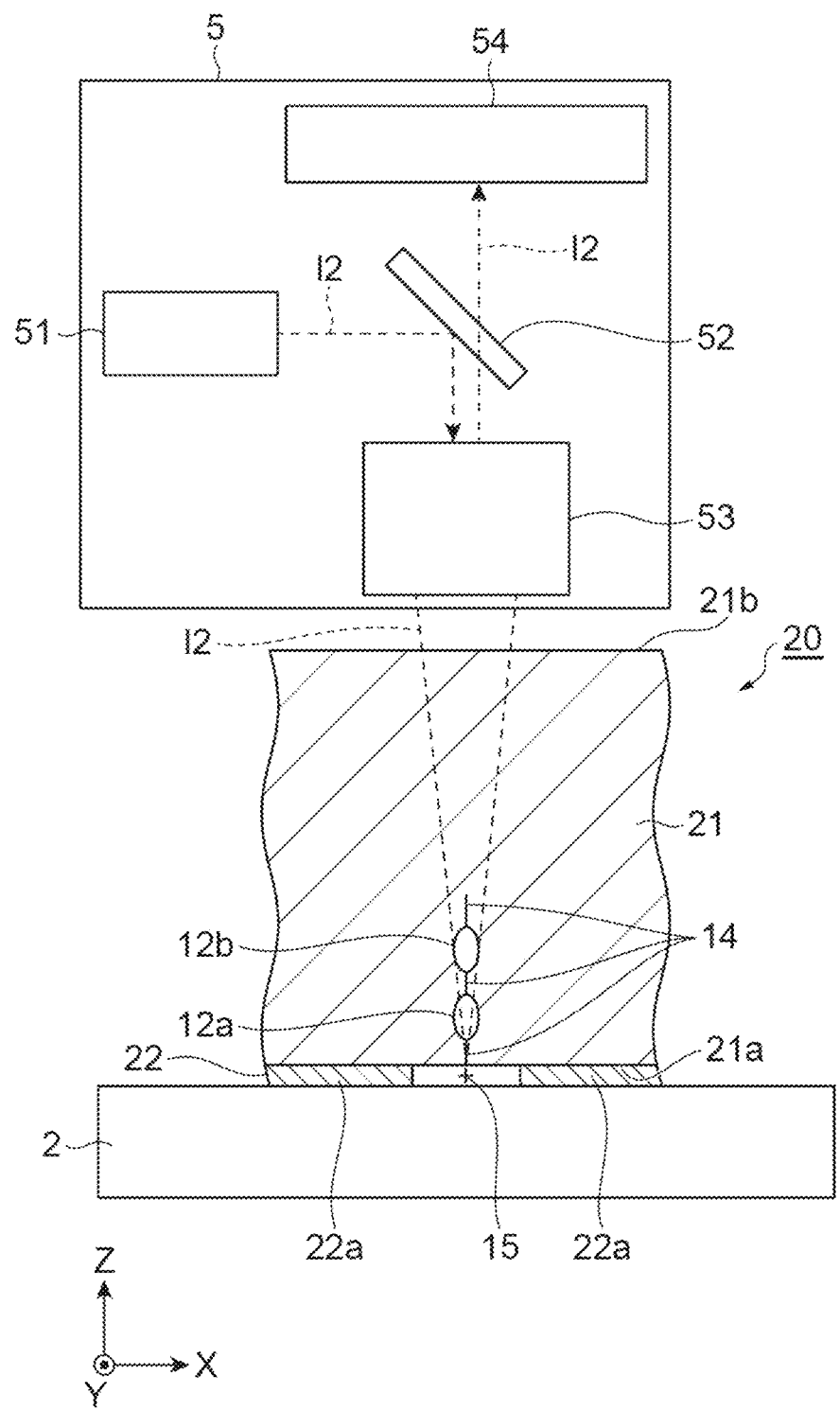
FIG. 6 is a view of a constitution of an image capturing unit for alignment correction illustrated in FIG. 1.

As illustrated in FIG. 6, the image capturing unit 5 has a light source 51, a mirror 52, a lens 53, and a light detection portion 54. The light source 51 outputs light I2 able to penetrate the semiconductor substrate 21. For example, the light source 51 is constituted of a halogen lamp and a filter and outputs the light I2 of a near infrared region. The light source 51 may be compatibly used as the light source 41 of the image capturing unit 4. The light I2 output from the light source 51 is reflected by the mirror 52 and passes through the lens 53, and the wafer 20 is irradiated therewith from the rear surface 21b side of the semiconductor substrate 21.

The lens 53 allows the light I2 reflected by the front surface 21a of the semiconductor substrate 21 to pass through. Namely, the lens 53 allows the light I2 propagated through the semiconductor substrate 21 to pass through. The number of apertures of the lens 53 is 0.3 or fewer. That is, the number of apertures of the object lens 43 of the image capturing unit 4 is larger than the number of apertures of the lens 53. The light detection portion 54 detects the light I2 which has passed through the lens 53 and the mirror 52. For example, the light detection portion 55 is constituted of an InGaAs camera and detects the light I2 of a near infrared region.

The image capturing unit 5 captures an image of the functional element layer 22 by irradiating the wafer 20 with the light I2 from the rear surface 21b side and detecting the light I2 returning from the front surface 21a (the functional element layer 22) under control of the control portion 8. In addition, similarly, the image capturing unit 5 irradiates the wafer 20 with the light I2 from the rear surface 21b side, and acquires images of regions including the modified regions 12a and 12b by detecting the light I2 returning from formation positions of the modified regions 12a and 12b in the semiconductor substrate 21 under control of the control portion 8. These images are used for alignment of the irradiation position of the laser light L. The image capturing unit 6 has a constitution similar to that of the image capturing unit 5 except that the lens 53 has a lower magnification (for example, the image capturing unit 5 of six magnifications and the image capturing unit 6 of 1.5 magnifications), and it is used for alignment similar to the image capturing unit 5.

[Principle of Image Capturing by Image Capturing Unit for Inspection]

Figure 7:
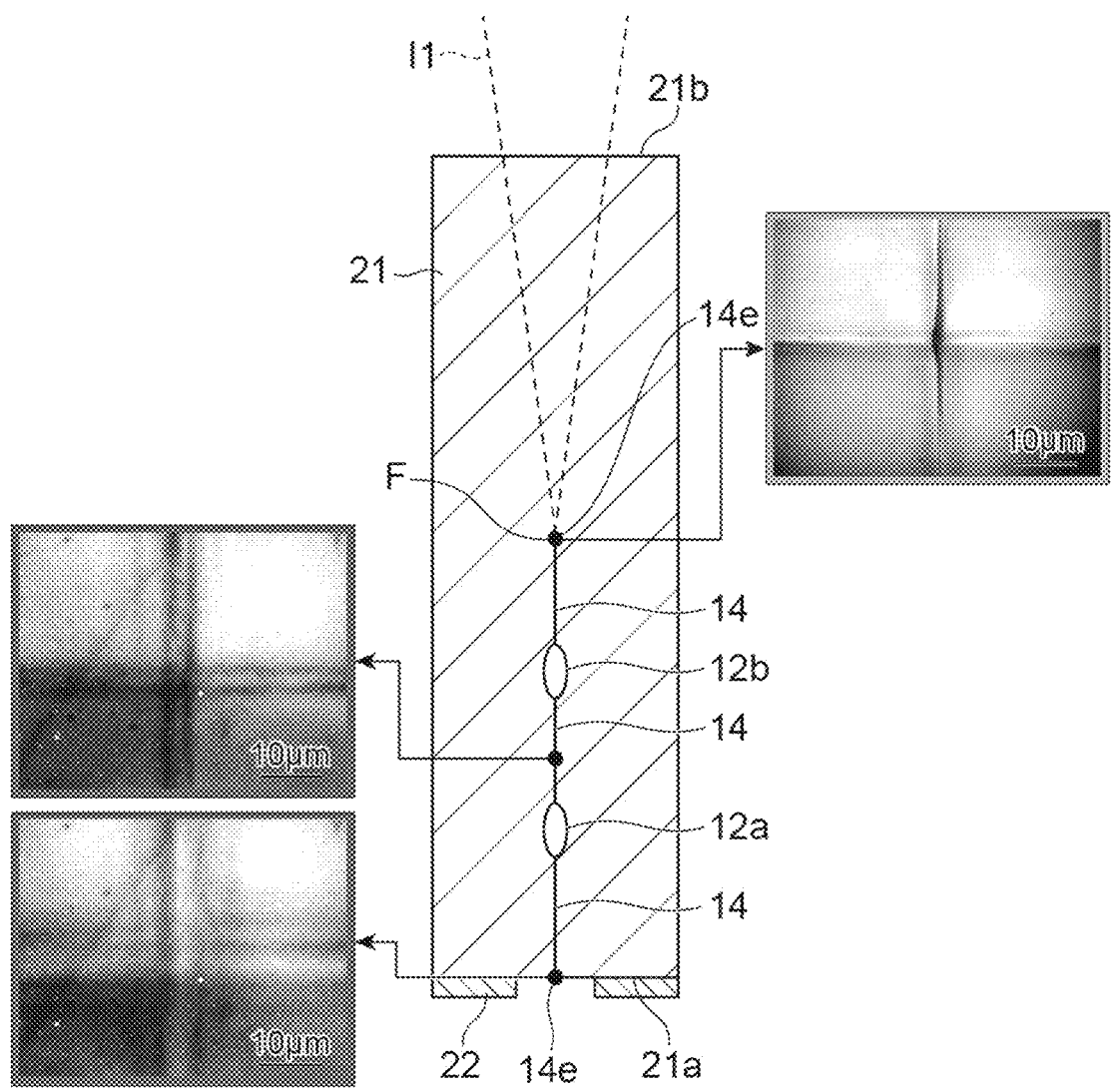
FIG. 7 is a cross-sectional view of the wafer for describing a principle of image capturing performed by the image capturing unit for inspection illustrated in FIG. 5 and shows images of locations captured by the image capturing unit for inspection.

Using the image capturing unit 4 illustrated in FIG. 5, as illustrated in FIG. 7, a focal point F (a focal point of the object lens 43) is moved from the rear surface 21b side toward the front surface 21a side with respect to the semiconductor substrate 21 in which the crack 14 across the two rows of the modified regions 12a and 12b has reached the front surface 21a. In this case, if the focal point F is focused from the rear surface 21b side on a tip 14e of the crack 14 extending from the modified region 12b to the rear surface 21b side, the tip 14e can be confirmed (the image on the right side in FIG. 7). However, even if the focal point F is focused from the rear surface 21b side on the crack 14 itself and the tip 14e of the crack 14 which has reached the front surface 21a, those cannot be confirmed (the image on the left side in FIG. 7). If the focal point F is focused on the front surface 21a of the semiconductor substrate 21 from the rear surface 21b side, the functional element layer 22 can be confirmed.

Figure 8:
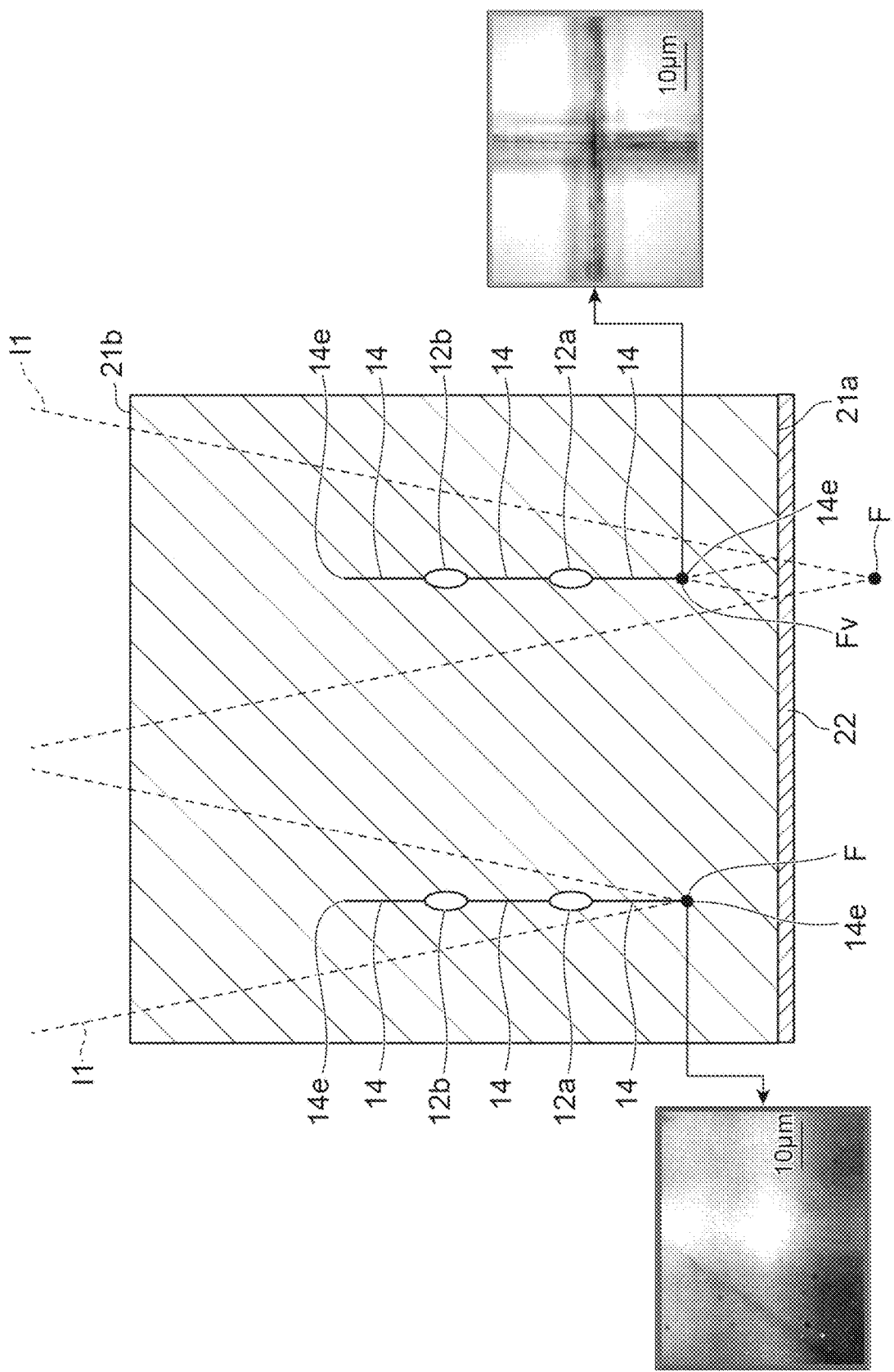
FIG. 8 is a cross-sectional view of the wafer for describing a principle of image capturing performed by the image capturing unit for inspection illustrated in FIG. 5 and shows images of locations captured by the image capturing unit for inspection.

In addition, using the image capturing unit 4 illustrated in FIG. 5, as illustrated in FIG. 8, the focal point F is moved from the rear surface 21b side toward the front surface 21a side with respect to the semiconductor substrate 21 in which the crack 14 across the two rows of the modified regions 12a and 12b has not reached the front surface 21a. In this case, even if the focal point F is focused from the rear surface 21b side on the tip 14e of the crack 14 extending from the modified region 12a to the front surface 21a side, the tip 14e cannot be confirmed (the image on the left side in FIG. 8).

However, if the focal point F is focused from the rear surface 21b side on a region on a side opposite to the rear surface 21b with respect to the front surface 21a (that is, a region on the functional element layer 22 side with respect to the front surface 21a) and an imaginary focal point Fv symmetrical with the focal point F with respect to the front surface 21a is positioned at the tip 14e, the tip 14e can be confirmed (the image on the right side in FIG. 8). The imaginary focal point Fv is a point symmetrical with the focal point F with respect to the front surface 21a in consideration of the refraction index of the semiconductor substrate 21.

Figure 9:
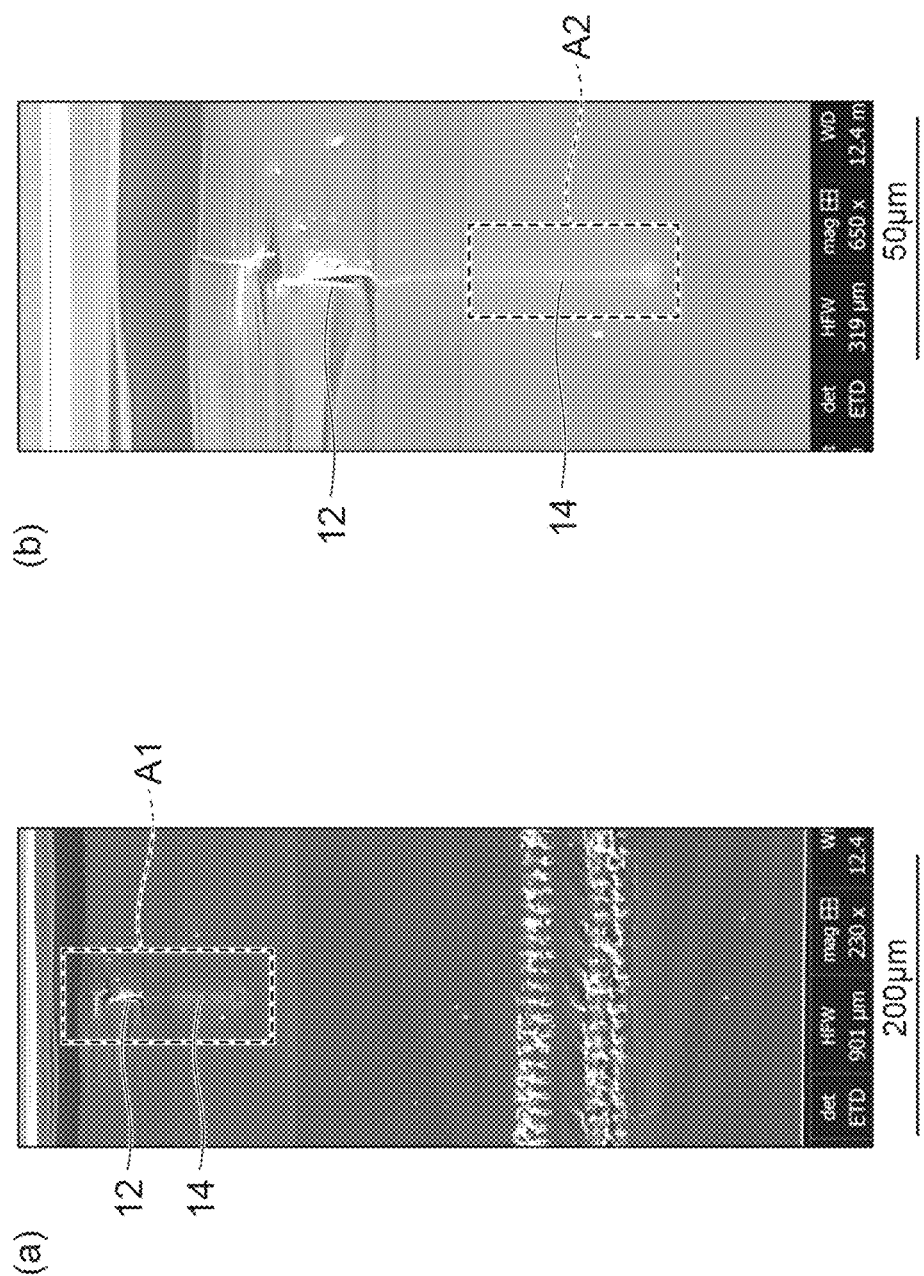
FIG. 9 shows SEM images of a modified region and a crack formed inside a semiconductor substrate.
Figure 10:
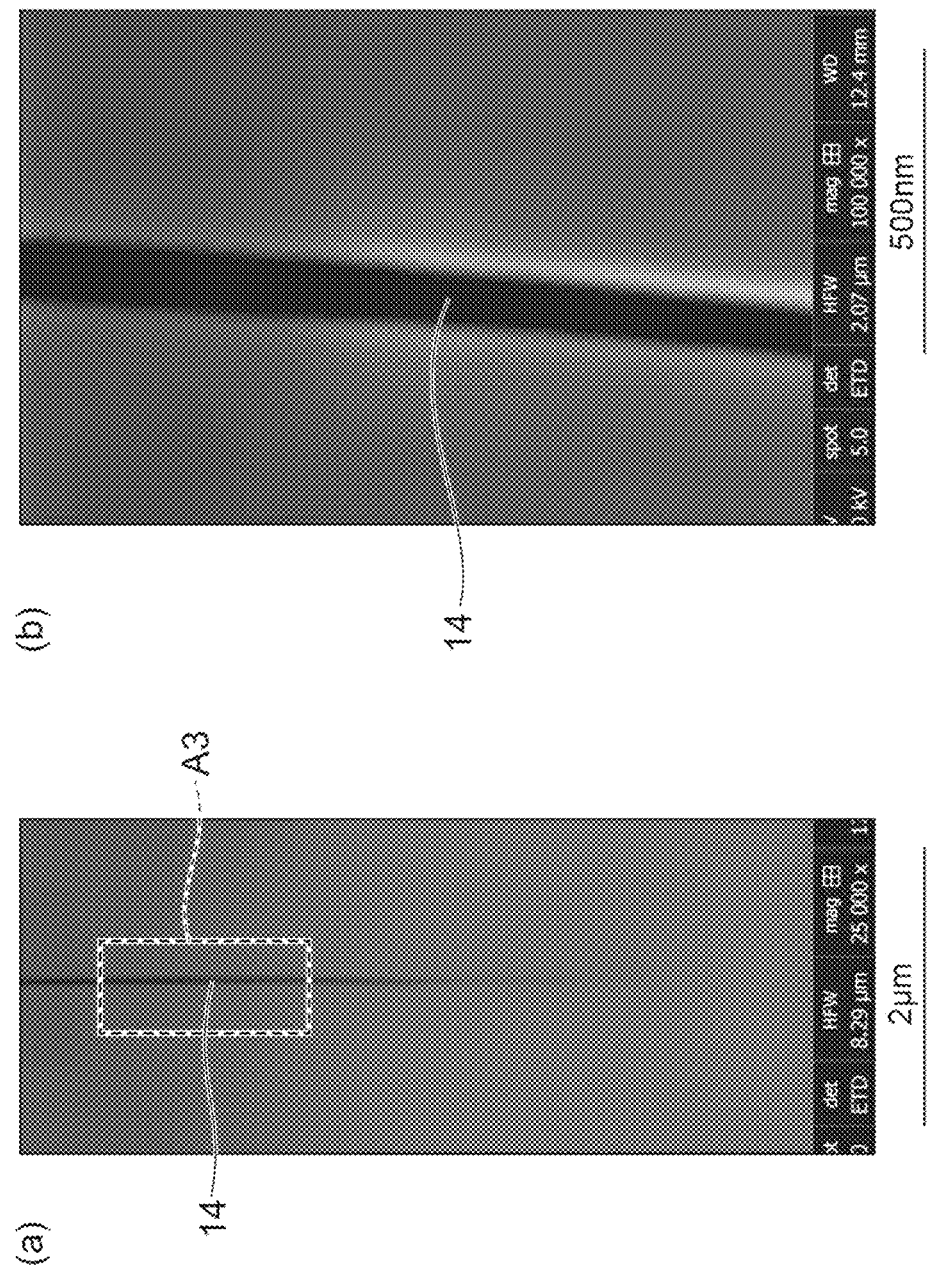
FIG. 10 shows SEM images of a modified region and a crack formed inside a semiconductor substrate.

It is assumed that the crack 14 itself cannot be confirmed as above because the width of the crack 14 is smaller than the wavelength of the light I1 (illumination light). FIGS. 9 and 10 are scanning electron microscope (SEM) images of the modified region 12 and the crack 14 formed inside the semiconductor substrate 21 (silicon substrate). FIG. 9(b) is an enlarged image of a region A1 illustrated in FIG. 9(a), FIG. 10(a) is an enlarged image of a region A2 illustrated in FIG. 9(b), and FIG. 10(b) is an enlarged image of a region A3 illustrated in FIG. 10(a). In this manner, the width of the crack 14 is approximately 120 nm and is smaller than the wavelength of the light I1 of a near infrared region (for example, 1.1 to 1.2 μm).

Figure 11:
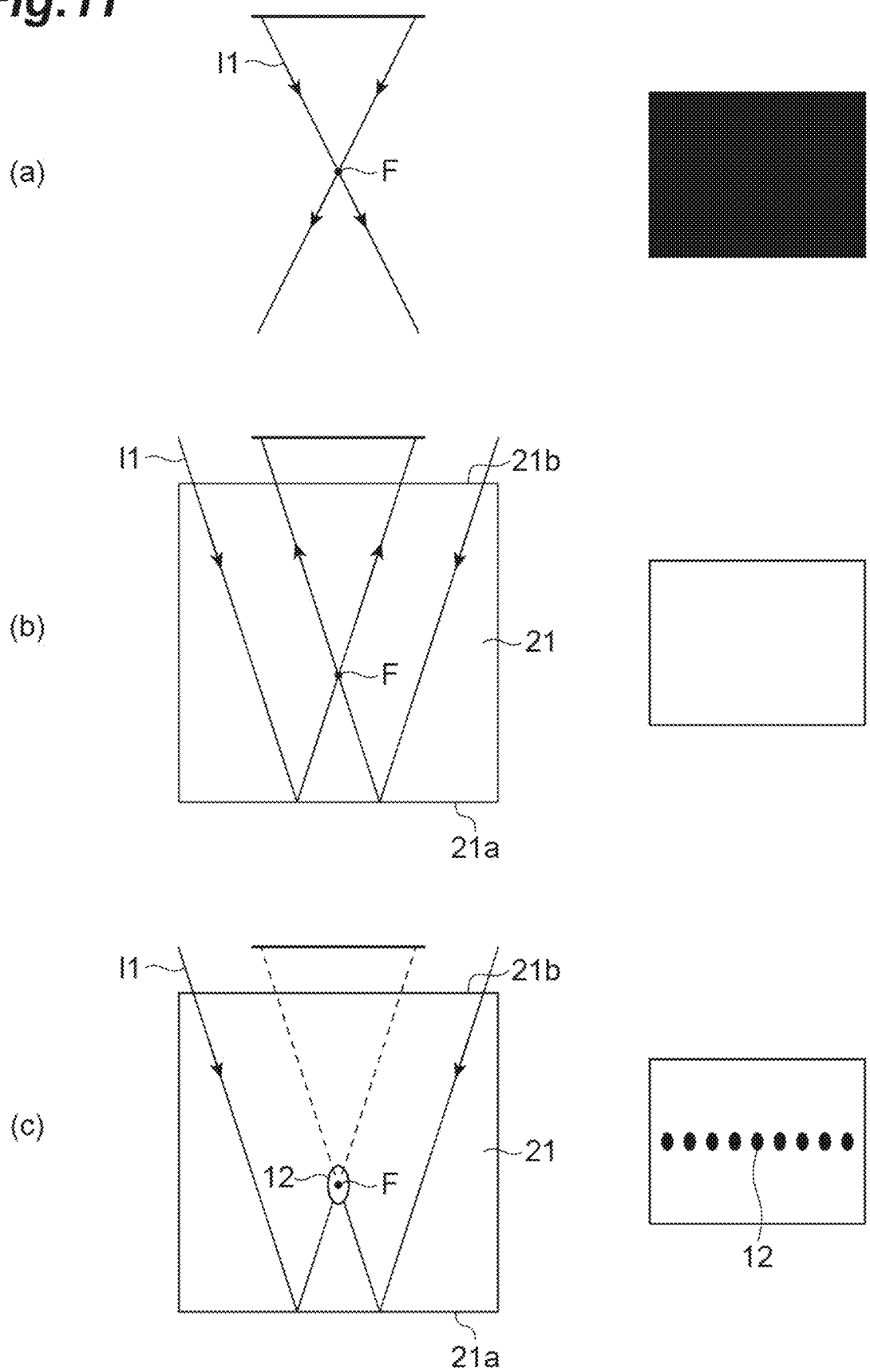
FIG. 11 is views of optical paths for describing a principle of image capturing performed by the image capturing unit for inspection illustrated in FIG. 5 and is schematic views illustrating images captured by the image capturing unit for inspection at focal points.

A principle of image capturing which is assumed based on those above is as follows. As illustrated in FIG. 11(a), if the focal point F is positioned in the air, the light I1 does not return. Therefore, a blackish image is obtained (the image on the right side in FIG. 11(a)). As illustrated in FIG. 11(b), if the focal point F is positioned inside the semiconductor substrate 21, the light I1 reflected by the front surface 21a returns. Therefore, a whitish image is obtained (the image on the right side in FIG. 11(b)). As illustrated in FIG. 11(c), if the focal point F is focused on the modified region 12 from the rear surface 21b side, the modified region 12 absorbs, scatters, or the like a part of the light I1 which has been reflected by the front surface 21a and has returned. Therefore, an image in which the blackish modified region 12 is imaged in a whitish background is obtained (the image on the right side in FIG. 11(c)).

Figure 12:
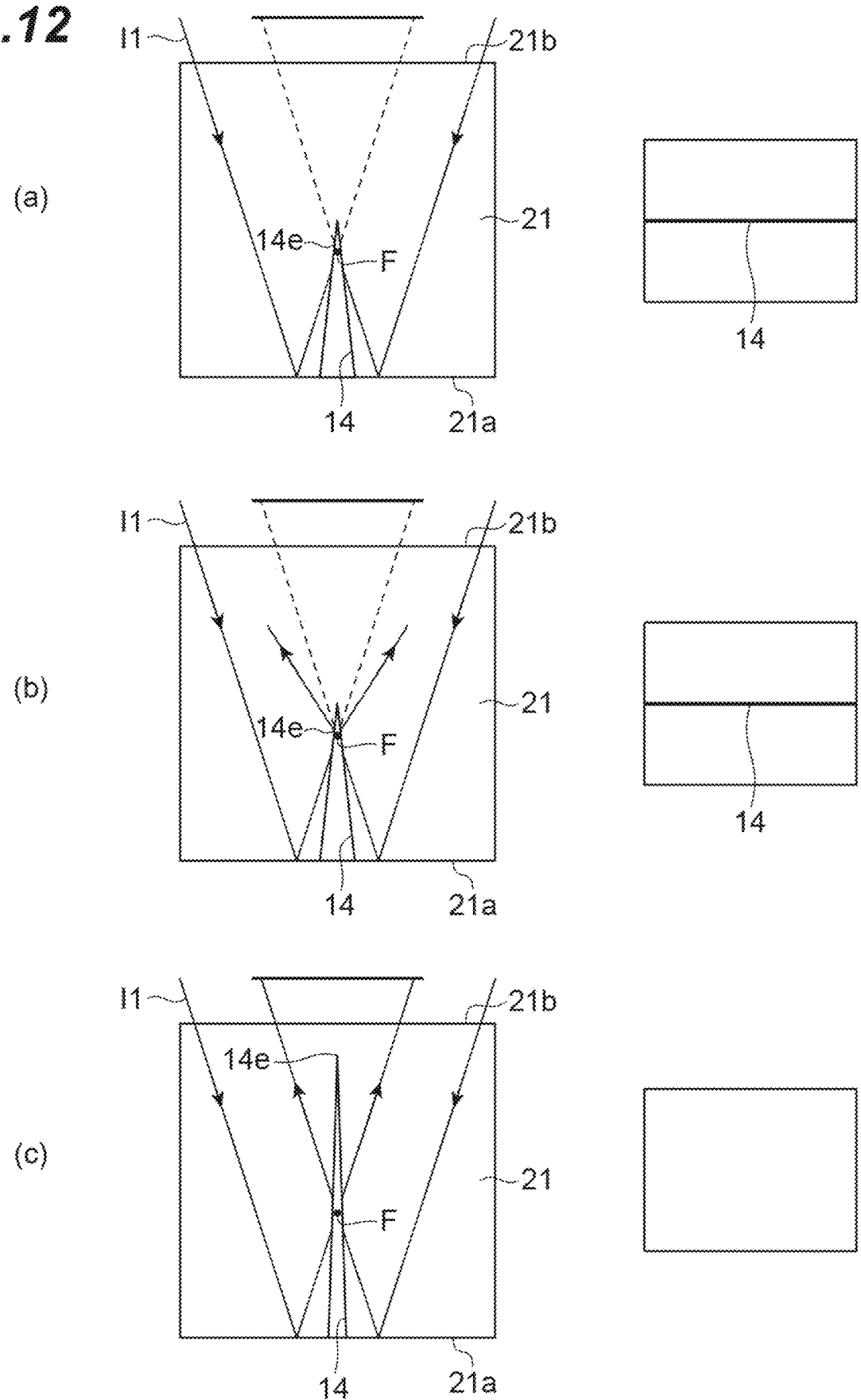
FIG. 12 is views of optical paths for describing a principle of image capturing performed by the image capturing unit for inspection illustrated in FIG. 5 and is schematic views illustrating images captured by the image capturing unit for inspection at focal points.

As illustrated in FIGS. 12(a) and 12(b), if the focal point F is focused on the tip 14e of the crack 14 from the rear surface 21b side, for example, scattering, reflection, interference, absorption, or the like occurs in a part of the light I1 which has been reflected by the front surface 21a and has returned due to optical peculiarities (stress concentration, distortion, discontinuity of atomic density, and the like) occurring in the vicinity of the tip 14e, confinement of light caused in the vicinity of the tip 14e, or the like. Therefore, images in which the blackish tip 14e is imaged in a whitish background are obtained (the images on the right sides in FIGS. 12(a) and 12(b)). As illustrated in FIG. 12(c), if the focal point F is focused from the rear surface 21b side on a part other than an area in the vicinity of the tip 14e of the crack 14, at least a part of the light I1 reflected by the front surface 21a returns. Therefore, a whitish image is obtained (the image on the right side in FIG. 12(c)).

Hereinafter, inspection and adjustment processing for a length of a crack performed as preprocessing of processing in which a modified region is formed for the purpose of cutting or the like of the wafer 20 will be described. The control portion 8 is configured to execute controlling the laser irradiation unit 3 such that one or a plurality of modified regions 12 for inspection are formed inside the semiconductor substrate 21 when the wafer 20 is irradiated with the laser light L (formation processing), determining whether or not a crack reaching state where the crack 14 extending from the modified region 12 has reached the front surface 21a side of the semiconductor substrate 21 has been realized on the basis of an image (a signal output from the image capturing unit 4) acquired in the image capturing unit 4 (determination processing), and deriving information related to adjustment of irradiation conditions of the laser irradiation unit 3 on the basis of determination results (adjustment processing).

(Formation Processing)

Figure 13:
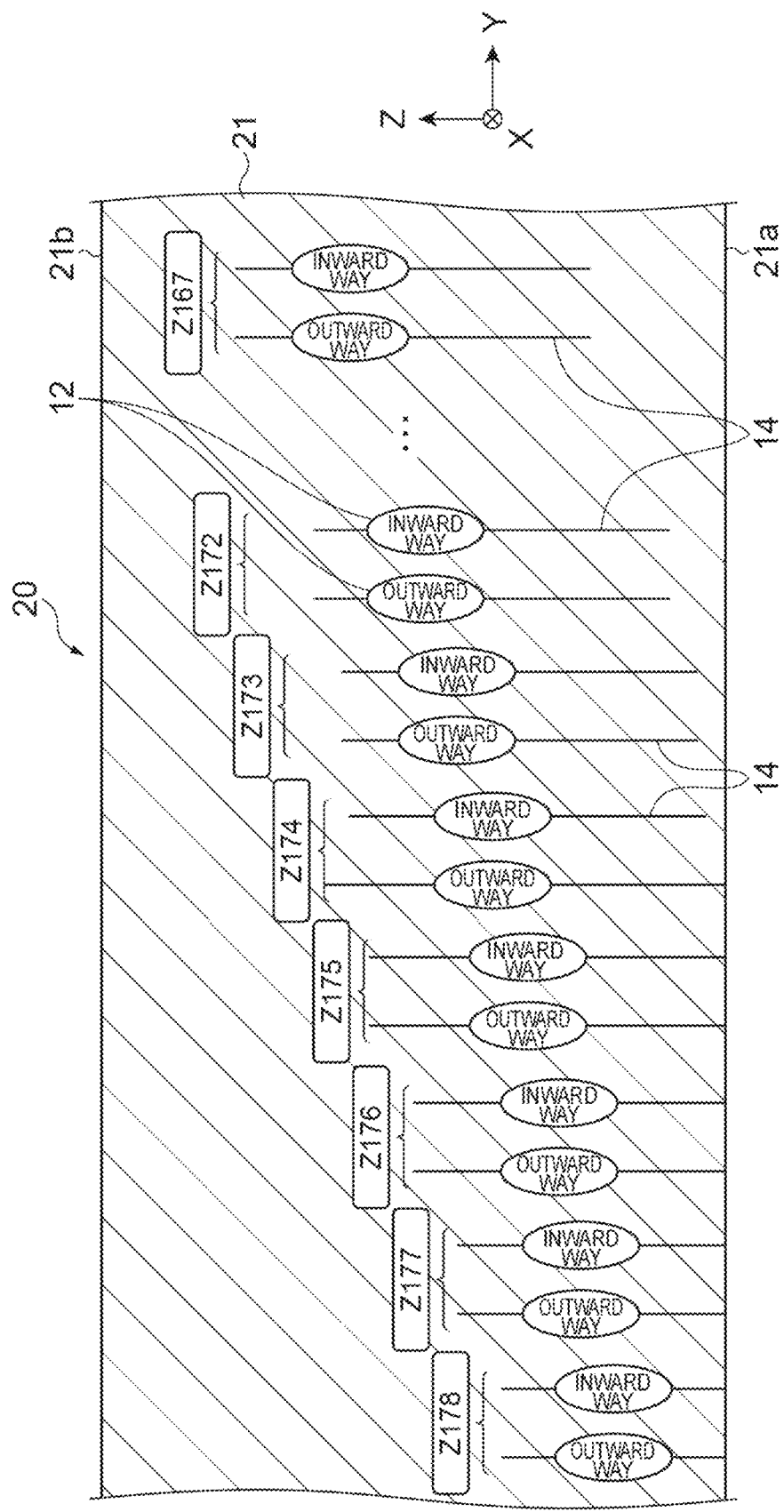
FIG. 13 is a schematic view illustrating an image of forming modified regions for inspection.

As illustrated in FIG. 13, in the formation processing, the control portion 8 controls the laser irradiation unit 3 such that the modified region 12 is formed along each of a plurality of lines in the wafer 20. In FIG. 13, a plurality of lines which extend in the X direction and are adjacent to each other in the Y direction are illustrated. The control portion 8 controls the laser irradiation unit 3 such that the modified regions 12 having formation depths different from each other are formed between the plurality of lines. In the example illustrated in FIG. 13, the formation depth of the modified region 12 in the line marked with "Z167" has become the shallowest, the formation depth of the modified region 12 has gradually become deeper as it is separated from the line marked with "Z167" in the Y direction, and the formation depth of the modified region in the line marked with "Z178" has become the deepest. The modified regions 12 of each line are formed when the wafer 20 is moved in the X direction with respect to the laser light L output from the laser irradiation unit 3. Movement of the wafer 20 in the X direction includes going (outward way) and returning (inward way), and the modified region 12 of the outward way and the modified region 12 of the inward way are formed for each line. In the determination processing described below, it is determined for each outward way and for each inward way whether or not the crack reaching state has been realized. This is because, for example, an optical axis or the like of the laser light L is not the same in the outward way and the inward way so that it is preferable to perform determination individually. In FIG. 13, only one modified region is illustrated as each modified region 12. However, actually, two modified regions 12a and 12b are formed as described above. Regarding the number of focal points, a single focal point, two focal points, or more focal points may be adopted.

(Determination Processing)

Figure 14:
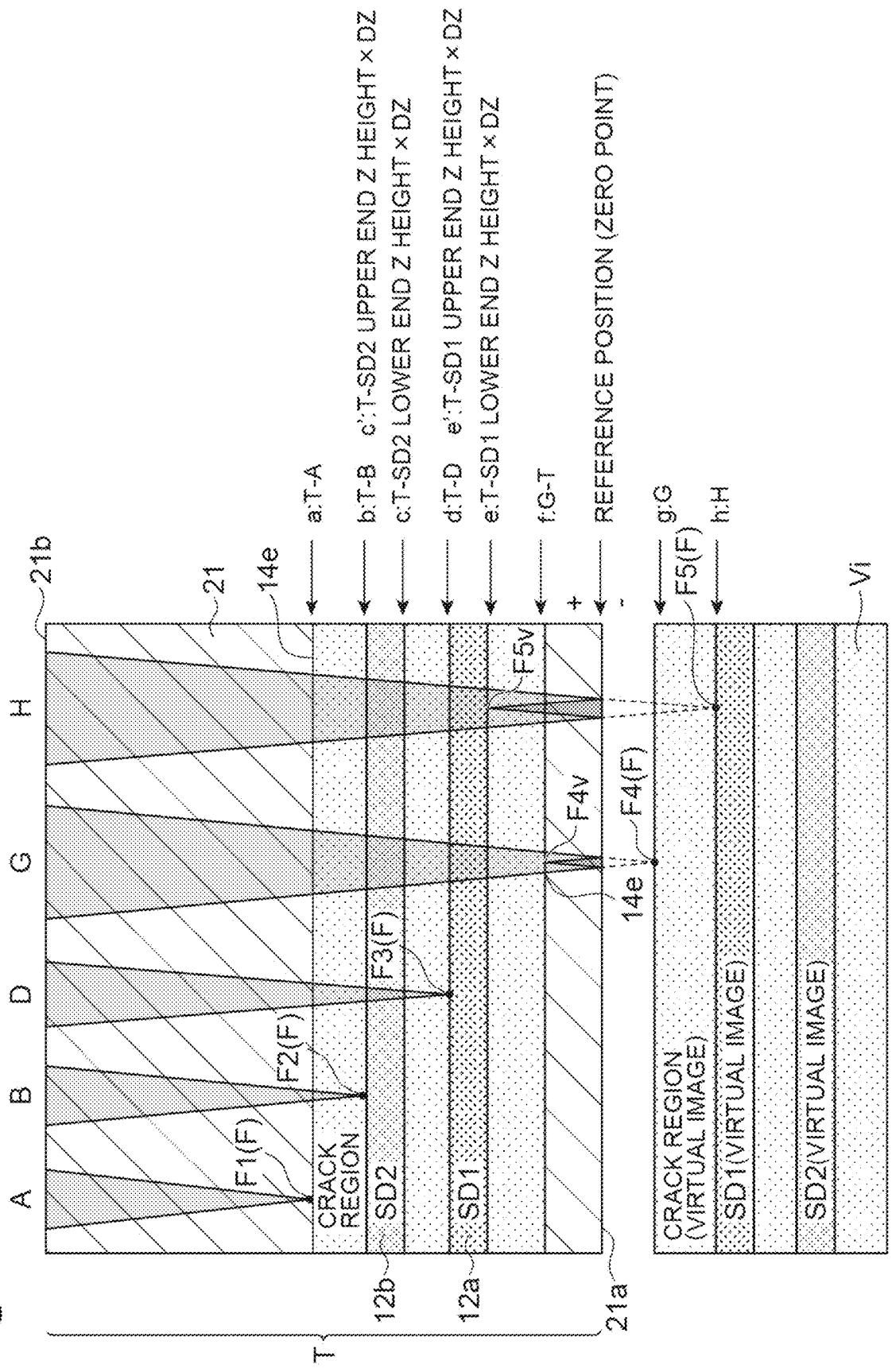
FIG. 14 is a schematic view illustrating an image of acquiring a plurality of images by moving a focal point F.

In the determination processing, the control portion 8 determines whether or not the crack reaching state where the crack 14 extending from the modified region 12 has reached the front surface 21a side of the semiconductor substrate 21 has been realized on the basis of an image acquired in the image capturing unit 4. As illustrated in FIG. 14, the control portion 8 controls the image capturing unit 4 so as to acquire a plurality of images by moving the focal point F in the Z direction. A focal point F1 is a focal point at which an image of the tip 14e of the crack 14 extending from the modified region 12b to the rear surface 21b side is captured. A focal point F2 is a focal point at which an image of an upper end of the modified region 12b is captured. A focal point F3 is a focal point at which an image an upper end of the modified region 12a is captured. A focal point F4 is a focal point of a virtual image region in which an image of the tip 14e of the crack 14 extending from the modified region 12a to the front surface 21a side is captured, and the focal point F4 is a point symmetrical with the position of the tip 14e (imaginary focal point F4v) with respect to the front surface 21a. A focal point F5 is a focal point of a virtual image region in which an image of a lower end of the modified region 12a is captured, and the focal point F5 is a point symmetrical with the position of the lower end of the modified region 12a (imaginary focal point F5v) with respect to the front surface 21a.

While having the front surface 21a as a reference position (zero point), when a direction toward the rear surface 21b is a positive direction, the thickness of the wafer 20 is T, the distance of the focal point F1 from the rear surface 21b side is A, the distance of the focal point F2 from the rear surface 21b side is B, the distance of the focal point F3 from the rear surface 21b side is D, the distance of the focal point F4 from the rear surface 21b side is G, and the distance of the focal point F5 from the rear surface 21b side is H, a position a of the tip 14e of the crack 14 extending from the modified region 12b to the rear surface 21b side (=T−A), a position b of the upper end of the modified region 12b (=T−B), a position d of the upper end of the modified region 12a (=T−D), a position f of the tip 14e of the crack 14 extending from the modified region 12a to the front surface 21a side (=G−T), and a position e of the lower end of the modified region 12a (=H−T) are established.

In addition, a position c of a lower end of the modified region 12b, a position e of the lower end of the modified region 12a, a position c' of the upper end of the modified region 12b, and a position e' of the upper end of the modified region 12a can be identified in accordance with a Z height that is a processing depth (height) in the laser processing device 1 and a constant (DZ rate) in consideration of the refraction index of a silicon of the wafer 20. When the Z height of the lower end of the modified region 12b is an SD2 lower end Z height, the Z height of the lower end of the modified region 12a is an SD1 lower end Z height, the Z height of the upper end of the modified region 12b is an SD2 upper end Z height, and the Z height of the upper end of the modified region 12a is an SD1 upper end Z height, the position c of the lower end of the modified region 12b (=T−SD2 lower end Z height×DZ), the position e of the lower end of the modified region 12a (=T−SD1 lower end Z height×DZ), the position c' of the upper end of the modified region 12b (=SD layer width expected from T−SD2 upper end Z height×DZ+laser energy), and the position e' of the upper end of the modified region 12a (=SD layer width expected from T−SD1 upper end Z height×DZ+laser energy) are established.

Image acquiring will be described in detail. The control portion 8 sets an image capturing section, an image capturing start position, an image capturing end position, and a Z interval of image capturing (an interval in the Z direction) in accordance with a classification of the crack 14 to be detected. The image capturing unit 4 successively performs image capturing from the image capturing start position to the image capturing end position in the set image capturing section at the set interval (the Z interval of image capturing). For example, when it is desired to detect the tip 14e of the crack 14 extending from the modified region 12b to the rear surface 21b side (which may hereinafter be described as "an upper crack"), the image capturing section is set at a position sufficiently close to the rear surface 21b where an area from the modified region 12b to the tip 14e of the upper crack cannot be detected, for example. A light condensing position of the modified region 12b can be acquired from information at the time of forming the modified region 12b in the formation processing. The image capturing section may be the entire section in the Z direction of which an image can be captured, that is, an area from a virtual image region Vi at the light condensing position of the modified region 12a (refer to FIG. 14) to the rear surface 21b. For example, the image capturing start position is a position farthest from the rear surface 21b in the image capturing section. For example, the image capturing end position is a position where the tip 14e of the upper crack is detected, a position where the tip 14e of the upper crack is detected and then is not detected at all, or a position where image capturing in the overall image capturing section has been completed. The Z interval of image capturing (the interval in the Z direction) may be variable (for example, images are sparsely captured at wide image-capturing intervals immediately after image capturing has started and images are frequently captured at narrow image-capturing intervals after the tip 14e of the upper crack has been detected) in an image capturing step or may be uniform from the image capturing start position to the image capturing end position.

In addition, for example, when it is desired to detect the tip 14e of the crack 14 extending from the modified region 12a to the front surface 21a side (which may hereinafter be described as "a lower crack"), the image capturing section is set in a virtual image region from the upper end position of the modified region 12a to the light condensing position of the modified region 12b, for example. The upper end position of the modified region 12a can be acquired from information of the light condensing position at the time of forming the modified region 12a in the formation processing and the width of the modified region 12a. The virtual image region of the light condensing position of the modified region 12b can be acquired from the information at the time of forming the modified region 12b in the formation processing. The image capturing section may be the entire section in the Z direction of which an image can be captured, that is, an area from the virtual image region Vi at the light condensing position of the modified region 12a (refer to FIG. 14) to the rear surface 21b. For example, the image capturing start position may be a position farthest from the rear surface 21b in the image capturing section or may be a position closest to the rear surface 21b side in the image capturing section. For example, the image capturing end position is a position where the tip 14e of the lower crack is detected, a position where the tip 14e of the lower crack is detected and then is not detected at all, or a position where image capturing in the overall image capturing section has been completed. The Z interval of image capturing (the interval in the Z direction) may be variable (for example, images are sparsely captured at wide image-capturing intervals immediately after image capturing has started and images are frequently captured at narrow image-capturing intervals after the tip 14e of the lower crack has been detected) in the image capturing step or may be uniform from the image capturing start position to the image capturing end position. Processing of detecting (determining) the tip 14e for an image captured by the image capturing unit 4 may be performed every time one image is captured or may be performed after images of the overall image capturing section are captured. In addition, processing of cleansing image capturing data and detecting (determining) the tip 14e may be performed using a technology of artificial intelligence or the like.

Determination of the crack reaching state will be described in detail. FIG. 15 shows an example of image capturing results at respective measurement points. The said respective measurement points indicate a plurality of lines "Z167" to "Z178" formed in the formation processing and having formation depths of the modified regions 12 different from each other (refer to FIG. 13). As described above, the formation depth of the modified region 12 of "Z167" is the shallowest, the formation depth of the modified region 12 becomes deeper in accordance with increase in the value of Z, and the formation depth of the modified region 12 of "Z178" is the deepest. For the respective measurement points (the modified regions 12 of each line), the control portion 8 controls the image capturing unit 4 so as to acquire a plurality of images by moving the focal point F in the Z direction and derives a: the position of the tip 14e of the upper crack, b: the position of the upper end of the modified region 12b (SD2), d: the position of the upper end of the modified region 12a (SD1), and f: the position of the tip 14e of the lower crack illustrated in FIG. 14 from the images (that is, from actual measurement values). In addition, for the respective measurement points, on the basis of the Z height and the DZ rate, the control portion 8 derives e: the position of the lower end of the modified region 12a, e': the position of the upper end of the modified region 12a, c: the position of the lower end of the modified region 12b, and c': the position of the upper end of the modified region 12b illustrated in FIG. 14. In addition, the control portion 8 derives a difference a–b between a: the position of the tip 14e of the upper crack and b: the position of the upper end of the modified region 12b. In addition, the control portion 8 derives a difference a–e between a: the position of the tip 14e of the upper crack and e: the position of the lower end of the modified region 12a. "Stealth (ST)" shown in the lowermost line of the table in FIG. 15 is a term for indicating a state where the crack 14 has not reached the rear surface 21b and the front surface 21a, and "bottom side half-cut (BHC)" is a term for indicating a state where the crack 14 has reached the front surface 21a (that is, the crack reaching state). Information of ST and BHC shown in the lowermost line of the table in FIG. 15 is information acquired through observation using a microscope in order to check the accuracy of the determination processing by the control portion 8 (which will be described below).

In the actual laser processing device 1, the laser irradiation unit 3 and the image capturing unit 4 are provided inside the same device, and the formation processing of the modified region 12 for inspection and the image capturing processing of the modified region 12 are successively performed. However, the laser irradiation unit and the image capturing unit are separate devices in an environment in which the image capturing results shown in FIG. 15 are obtained. Therefore, the crack 14 has extended (the crack 14 has further extended than the image capturing results by the actual laser processing device 1) when the wafer 20 is conveyed between the devices. However, even with the image capturing results shown in FIG. 15, the accuracy of the determination processing by the control portion 8 (the accuracy of processing of identifying that the crack reaching state has been realized) can be described. Therefore, hereinafter, on the basis of the image capturing results shown in FIG. 15, the determination processing of the control portion 8 will be described.

Figure 16:
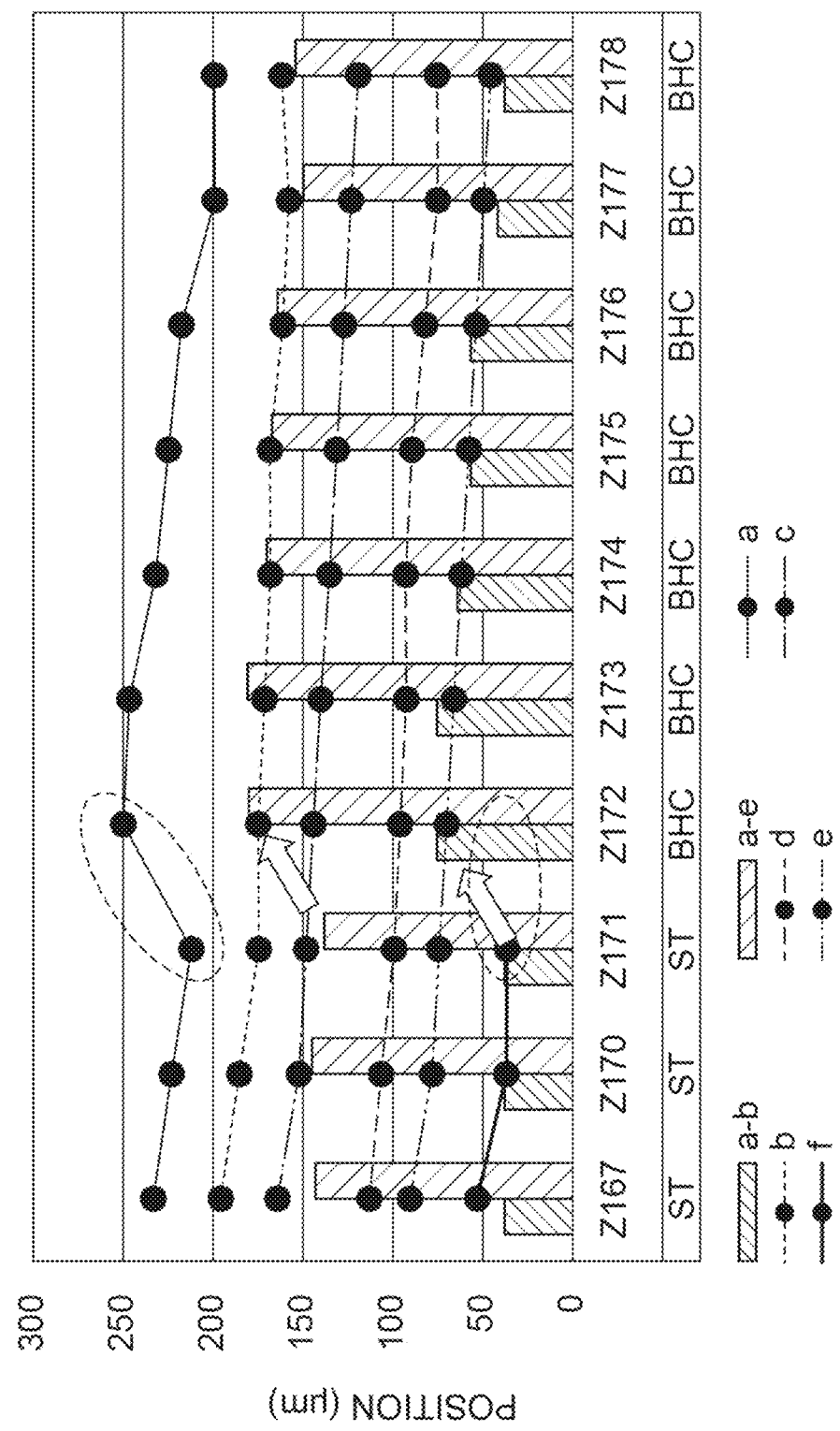
FIG. 16 is a graphed diagram of the image capturing results shown in FIG. 15.

FIG. 16 is a graphed diagram of the image capturing results shown in FIG. 15. The horizontal axis indicates measurement points, and the vertical axis indicates positions (positions when the front surface 21a is set as a reference position). In addition, similar to FIG. 15, also in FIG. 16, information of ST or BHC acquired through observation using a microscope is shown in the lowermost line.

The control portion 8 may derive the position of the tip 14e of the upper crack on the rear surface 21b side, which is a crack extending from the modified region 12 to the rear surface 21b side, in order from a measurement point (a line) having a shallower formation depth of the modified region 12 or in order from a measurement point (a line) having a deeper formation depth of the modified region 12, and may determine whether or not the crack reaching state has been realized on the basis of an amount of change in the position of the tip 14e. Specifically, in a case where the position of the tip 14e of the upper crack is derived in order from a measurement point having a shallower formation depth of the modified region 12 so as to derive the amount of change in the position of the tip 14e, when the amount of change in the position of the tip 14e of the upper crack becomes larger than a predetermined value (for example, 20 µm), although the state has been the ST state in the previous lines, the control portion 8 determines that the crack reaching state has been realized. In addition, in a case where the position of the tip 14e of the upper crack is derived in order from a measurement point having a deeper formation depth of the modified region 12 so as to derive the amount of change in the position of the tip 14e, when the amount of change in the position of the tip 14e of the upper crack becomes larger than the predetermined value (for example, 20 µm), although the state has been the crack reaching state in the previous lines, the control portion 8 determines that the ST state has been realized.

As illustrated in FIG. 16, in terms of change in a: the position of the tip 14e of the upper crack with the measurement points arranged in order from that having a shallower formation depth of the modified region 12, it is ascertained that the amount of change (the difference) between Z171 and Z172 is extremely large compared to the amounts of change between other measurement points. Z171 is a measurement point having the deepest formation depth of the modified region 12 in the ST measurement points, and Z172 is a measurement point having the shallowest formation depth of the modified region 12 in the BHC measurement points. From these, it is possible to say that it can be determined whether or not the BHC state (the crack reaching state) has been realized on the basis of whether or not the amount of change is larger than the predetermined value by deriving a: the position of the tip 14e of the upper crack in order from a measurement point having a shallower formation depth of the modified region 12 or in order from a measurement point having a deeper formation depth of the modified region so as to derive the amount of change in the position of the tip 14e.

The control portion 8 may derive the difference between the position of the tip 14e of the upper crack on the rear surface 21b side, which is a crack extending from the modified region 12 to the rear surface 21b side, and the position where the modified region 12 is formed in order from a measurement point (a line) having a shallower formation depth of the modified region 12 or in order from a measurement point (a line) having a deeper formation depth of the modified region 12, and may determine whether or not the crack reaching state has been realized on the basis of the amount of change in the difference. Specifically, in a case where the difference described above is derived in order from a measurement point having a shallower formation depth of the modified region 12, when the amount of change in the difference becomes larger than the predetermined value (for example, 20 µm), although the state has been the ST state in the previous lines, the control portion 8 determines that the crack reaching state has been realized. In addition, in a case where the difference described above is derived in order from a measurement point having a deeper formation depth of the modified region 12, when the amount of change in the difference becomes larger than the predetermined value (for example, 20 µm), although the state has been the crack reaching state in the previous lines, the control portion 8 determines that the ST state has been realized.

As illustrated in FIG. 16, in terms of change in the difference a–b: between the position of the tip 14e of the upper crack and the position of the upper end of the modified region 12b (which may hereinafter be simply described as "a difference between the position of the tip 14e of the upper crack and the position where the modified region 12b is formed") with the measurement points arranged in order from that having a shallower formation depth of the modified region 12, it is ascertained that the amount of change between Z171 and Z172 is extremely large compared to the amounts of change between other measurement points. Similarly, in terms of change in the difference a–e: between the position of the tip 14e of the upper crack and the position of the lower end of the modified region 12a (which may hereinafter be simply described as "a difference between the position of the tip 14e of the upper crack and the position where the modified region 12a is formed"), it is ascertained that the amount of change between Z171 and Z172 is extremely large compared to the amounts of change between other measurement points. From these, it is possible to say that it can be determined whether or not the BHC state (the crack reaching state) has been realized on the basis of whether or not the amount of change is larger than the predetermined value by deriving the difference a–b or a–e in order from a measurement point having a shallower formation depth of the modified region 12 or in order from a measurement point having a deeper formation depth of the modified region so as to derive the amounts of change in these.

The control portion 8 may determine whether or not the BHC state (the crack reaching state) has been realized on the basis of the presence or absence of the tip 14e of the lower crack on the front surface 21a side, which is a crack extending from the modified region 12a to the front surface 21a side. As illustrated in FIG. 16, at the ST measurement point, f: the position of the tip 14e of the lower crack has been detected. On the contrary, at the BHC measurement point, f: the position of the tip 14e of the lower crack has not been detected. From these, it is possible to say that it can be determined whether or not the BHC state (the crack reaching state) has been realized in accordance with the presence or absence of the tip 14e of the lower crack.

The control portion 8 estimates the length of the crack (specifically, the lower crack) on the basis of the determination results whether or not the BHC state has been realized. When it is determined that the BHC state has been realized, the control portion 8 may estimate the position e of the lower end of the modified region 12a (the length from the front surface 21a to the position e of the lower end) as a length L of the lower crack. In this case, the length L of the lower crack is derived by the following expression (1). In this case, the length L of the lower crack can be estimated from only the conditions which have been given in advance without using any actual measurement values. T indicates the thickness of the wafer 20, ZH1 indicates the Z height corresponding to the lower end of the modified region 12a, and DZ indicates the DZ rate.

$$L=e=T-ZH1\times DZ \quad (1)$$

In addition, when it is determined that the BHC state has been realized, the control portion 8 may derive the length L of the lower crack by the following expression (2) using the conditions which have been given in advance and the actual measurement values. D indicates the length from the rear surface 21b to the upper end of the modified region 12a, and SW indicates the width of the modified region 12a which is set in advance in accordance with processing conditions.

$$L=T-(D+SW) \quad (2)$$

Moreover, even when the thickness T of the wafer 20 is unknown, the control portion 8 can derive the length L of the lower crack by the following expression (3) on the basis of the actual measurement values. D indicates the length from the rear surface 21b to the upper end of the modified region 12a, SW indicates the width of the modified region 12a which is set in advance in accordance with the processing conditions, and H indicates the length from the rear surface 21b to the lower end of the modified region 12a.

$$L=(D+SW-H)/2 \quad (3)$$

The control portion 8 determines a pass or a fail for inspection on the basis of the estimated length of the lower crack. In the case of a fail for the inspection, the control portion 8 decides to derive information related to adjustment of the irradiation conditions of the laser irradiation unit 3 (that is, performs the adjustment processing described above). For example, the control portion 8 determines a pass or a fail for inspection by comparing the length of the lower crack and a crack length target value. The crack length target value indicates a target value for the length of the lower crack, and it may be a value set in advance, for example, it may be a value set in accordance with inspection conditions including at least information related to the thickness of the wafer 20 (details will be described below). The crack length target value may be a value stipulating a lower limit for the length of the crack to be passed, may be a value stipulating an upper limit for the length of the crack to be passed, or may be a value stipulating a range (a lower limit and conditions) of the length of the crack to be passed. In a case where the crack length target value is a value stipulating the lower limit for the length of the crack to be passed, when the estimated length of the lower crack is shorter than the crack length target value, the control portion 8 determines a fail for the inspection, thereby requiring adjustment of the irradiation conditions. In addition, in a case where the crack length target value is a value stipulating the upper limit for the length of the crack to be passed, when the estimated length of the lower crack is longer than the crack length target value, the control portion 8 determines a fail for the inspection. In addition, in a case where the crack length target value is a value stipulating the range of the length of the crack to be passed, when the estimated length of the lower crack is out of the range of the crack length target value, the control portion 8 determines a fail for the inspection. When a pass is determined for the inspection, the control portion 8 decides not to perform adjustment of the irradiation conditions (that is, the adjustment processing described above is not performed). However, even in a case of a pass for the inspection, the control portion 8 may perform adjustment of the irradiation conditions in accordance with a user's request.

(Adjustment Processing)

In the adjustment processing, the control portion 8 derives information related to adjustment of the irradiation conditions of the laser irradiation unit 3 on the basis of the determination results in the determination processing. More specifically, the control portion 8 derives information related to adjustment of the irradiation conditions (correction parameters) on the basis of the estimated length of the lower crack in accordance with the determination results. For example, when the length of the lower crack is short (shorter than the crack length target value stipulating the lower limit), the control portion 8 derives the correction parameters such that the length of the crack becomes longer than the crack length target value. In addition, for example, when the length of the lower crack is long (longer than the crack length target value stipulating the upper limit), the control portion 8 derives the correction parameters such that the length of the crack becomes shorter than the crack length target value. For example, information related to adjustment of the irradiation conditions (the correction parameters) is information regarding a laser and optical setting values, such as a light condensing correction amount, a processing output, and a pulse width.

Figure 17:
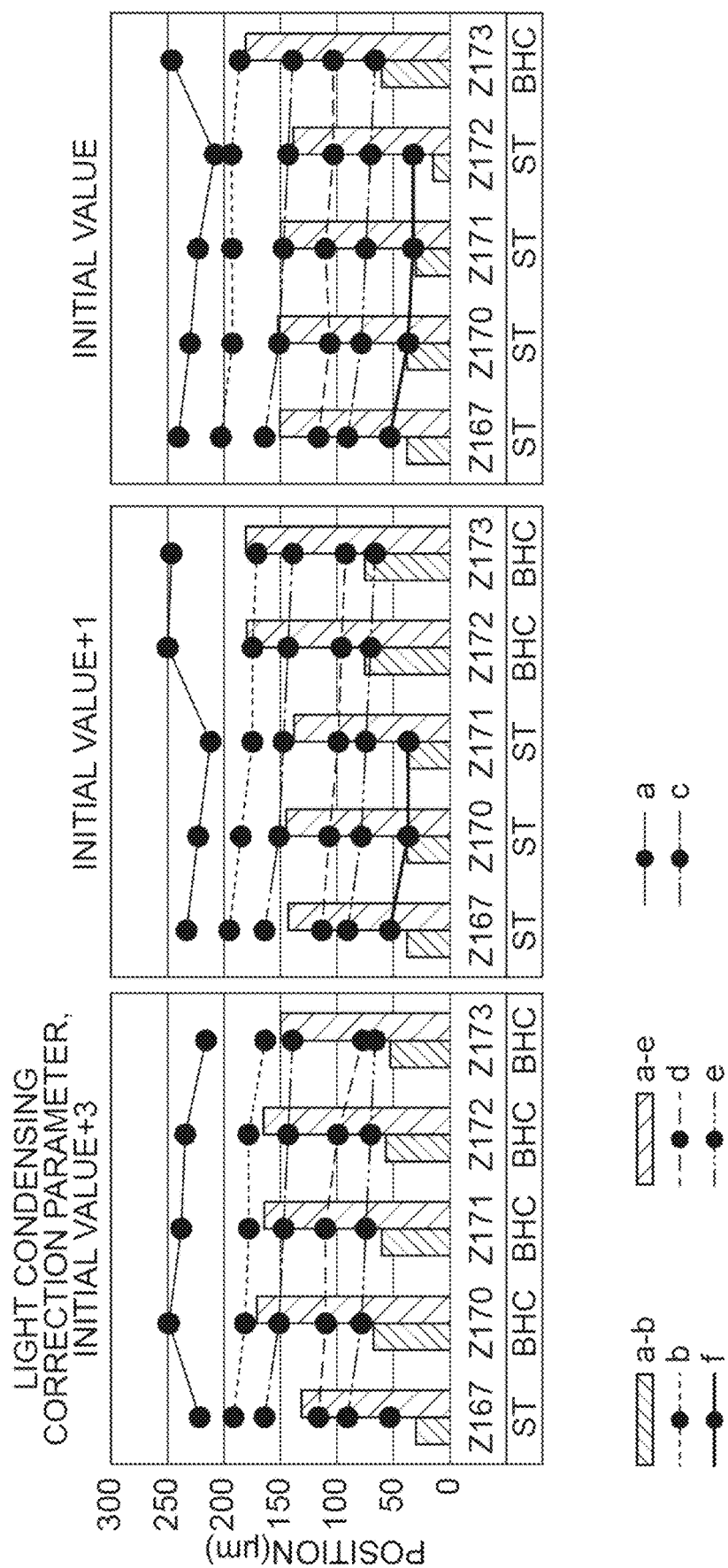
FIG. 17 is a view showing an example of differences between BHC measurement points when light condensing correction parameters (light condensing correction amounts) are changed.

The control portion 8 adjusts the irradiation conditions of the laser irradiation unit 3 on the basis of the derived correction parameters. That is, the control portion 8 sets appropriate values for the light condensing correction amount, the processing output, the pulse width, and the like which have been derived in the laser irradiation unit 3 such that the length of the crack becomes longer or shorter than a current state. FIG. 17 is a view showing an example of differences between BHC measurement points when light condensing correction parameters (light condensing correction amounts) are changed. As illustrated in the diagram on the right side in FIG. 17, in an initial value before the adjustment processing is performed, the BHC state has been realized for the first time in Z173. However, when the light condensing correction parameters are adjusted for increment of +1 such that the light condensing correction amount increases, the lower crack is lengthened. Therefore, the BHC state has been realized in Z172 as illustrated in the diagram at the center in FIG. 17. Moreover, when the light condensing correction parameters are adjusted for increment of +3, the BHC state has been realized in Z170 as illustrated in the diagram on the left side in FIG. 17. In this manner, the length of the lower crack can be adjusted to a desired length by adjusting the irradiation conditions of the laser irradiation unit 3 on the basis of the determination results in the determination processing. The control portion 8 may derive information related to adjustment of the irradiation conditions and perform adjustment of the irradiation conditions only when a user requests to perform adjustment of the irradiation conditions in a user's request (details will be described below).

[Inspection Method]

Figure 18:
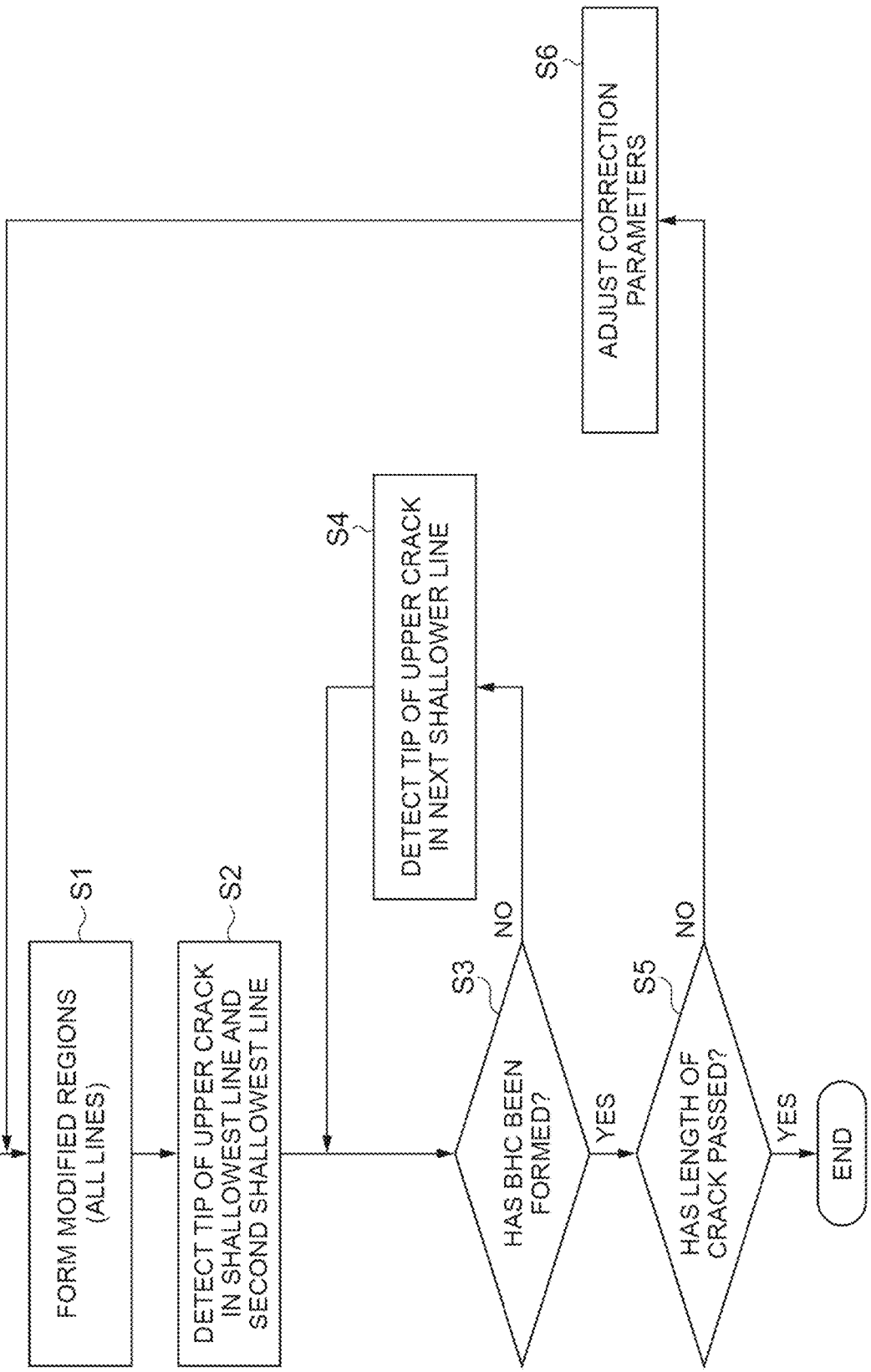
FIG. 18 is a flowchart of a first inspection method.
Figure 19:
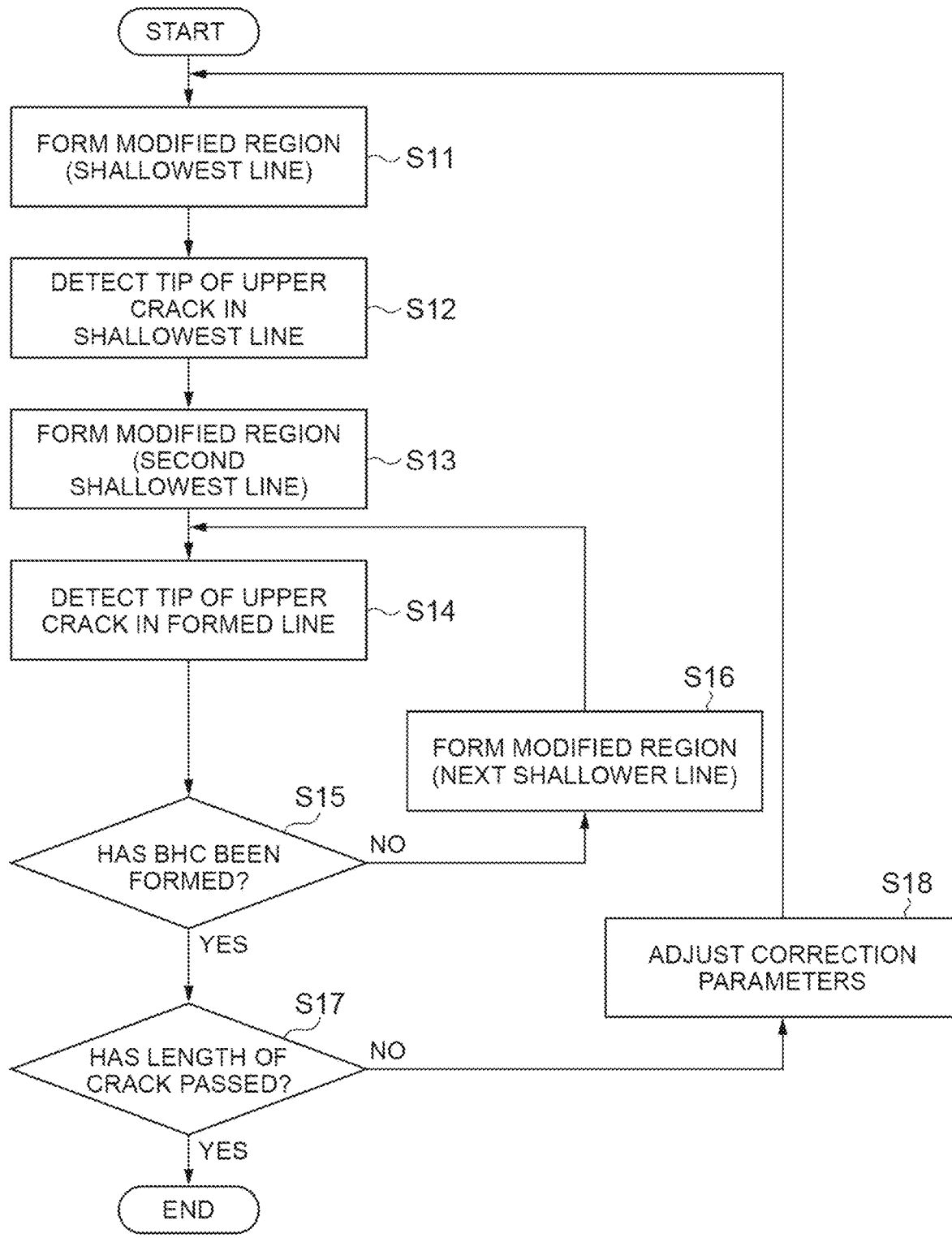
FIG. 19 is a flowchart of a second inspection method.
Figure 20:
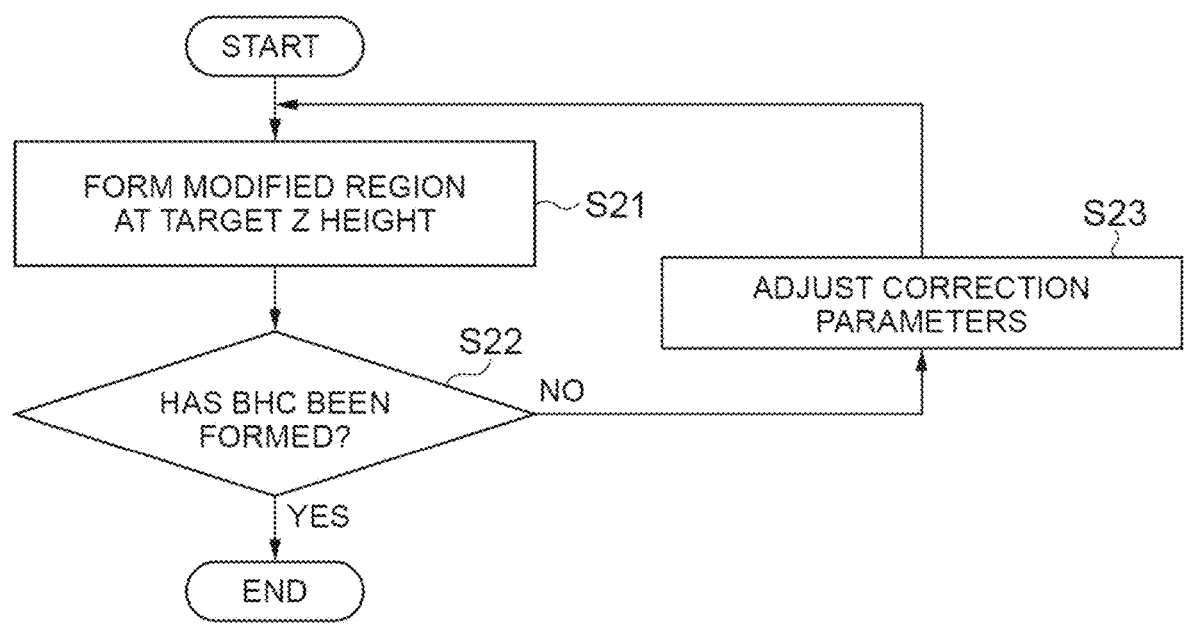
FIG. 20 is a flowchart of a third inspection method.
Figure 21:
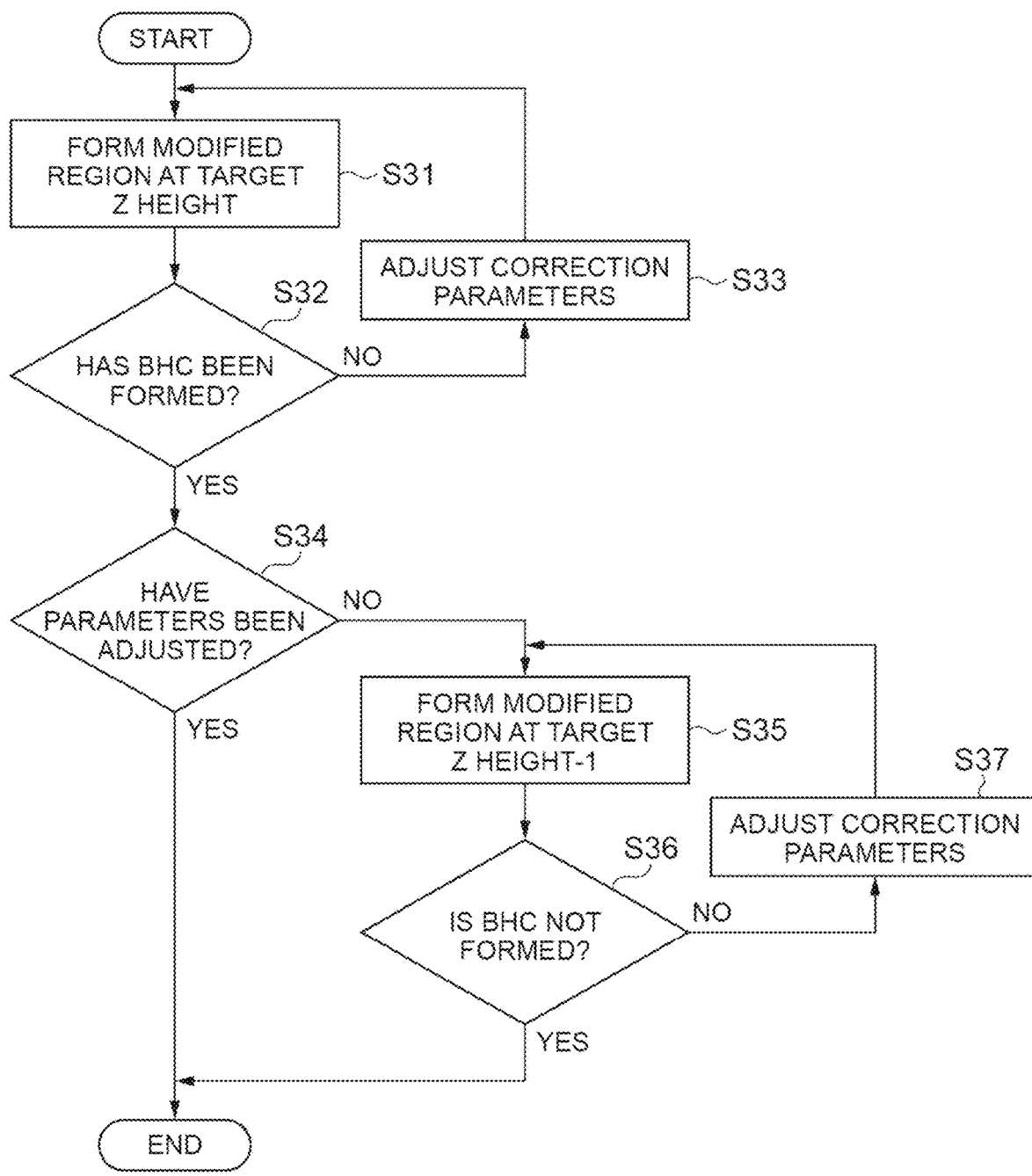
FIG. 21 is a flowchart of a fourth inspection method.

An inspection method of the present embodiment will be described with reference to FIGS. 18 to 21. FIG. 18 is a flowchart of a first inspection method. FIG. 19 is a flowchart of a second inspection method. FIG. 20 is a flowchart of a third inspection method. FIG. 21 is a flowchart of a fourth inspection method.

In the first inspection method illustrated in FIG. 18, the modified region 12 is formed for all of the lines to be subjected to inspection. Thereafter, it is determined whether or not the BHC state has been realized in order from a line having a shallowest formation depth of the modified region 12. When the BHC state has been realized, adjustment of the irradiation conditions (adjustment of the correction parameters) is performed on the basis of the length of the lower crack.

In the first inspection method, first, the modified region 12 is formed for all of the lines to be subjected to inspection (Step S1). Here, for each of the lines "Z167" to "Z178" illustrated in FIG. 13, it is assumed that the modified regions 12 of the outward way and the inward way are formed. As illustrated in FIG. 13, the modified regions 12 of each line are formed such that the formation depth of the modified region 12 in the line marked with "Z167" becomes the shallowest, the formation depth of the modified region 12 becomes gradually deep as it is separated from the line marked with "Z167" (the value of Z increases) in the Y direction, and the formation depth of the modified region 12 in the line marked with "Z178" becomes the deepest.

Step S1 will be specifically described. First, the wafer 20 is prepared and is placed on the stage 2 of the laser processing device 1. The wafer 20 to be used may be in a state where a film (a tape) is attached or not attached. The size, the shape, and the kind (the material, the crystal orientation, and the like) of the wafer 20 are not limited. Subsequently, alignment is performed when the stage 2 moves in the X direction, the Y direction, and a θ direction (a rotation direction centering on an axis parallel to the Z direction).

Further, the stage 2 moves in the Y direction such that a processing scheduled line for the outward way of "Z167" is located immediately below the laser irradiation unit 3, and the laser irradiation unit 3 moves by a processing depth corresponding to "Z167". Subsequently, the laser irradiation unit 3 starts irradiation of the laser light L, and the stage 2 moves in the X direction at a predetermined processing speed. Accordingly, the modified regions 12 (two rows of the modified regions 12*a* and 12*b*) are formed along the line for the outward way of "Z167" extending in the X direction.

Subsequently, the stage 2 moves in the Y direction such that a processing scheduled line for the inward way of "Z167" is located immediately below the laser irradiation unit 3, and the laser irradiation unit 3 moves by a processing depth corresponding to "Z167". Further, the laser irradiation unit 3 starts irradiation of the laser light L, and the stage 2 moves in the X direction at the predetermined processing speed. Accordingly, the modified regions 12 (two rows of the modified regions 12*a* and 12*b*) are formed along the line for the inward way of "Z167" extending in the X direction. Such formation of the modified regions 12*a* and 12*b* in the outward way and the inward way is performed for all of the lines ("Z167" to "Z178") while having the processing depth is set to a depth corresponding to each line. The above is the processing of Step S1.

Subsequently, the control portion 8 detects the position of the tip 14*e* of the upper crack for a line having the shallowest formation depth of the modified region 12 and the second shallowest line (Step S2). Specifically, first, the stage 2 moves in the X direction and the Y direction such that the line for the outward way of "Z167" is located immediately below the image capturing unit 4, and the image capturing unit 4 moves to the image capturing start position. The image capturing unit 4 successively performs image capturing from the image capturing start position to the image capturing end position at the set interval (the Z interval of image capturing). The control portion 8 performs cleansing of a plurality of pieces of image data acquired by the image capturing unit 4 and detects the tip 14*e* of the upper crack. Subsequently, the stage 2 moves in the X direction and the Y direction such that the line for the outward way of "Z168" is located immediately below the image capturing unit 4, and the image capturing unit 4 moves to the image capturing start position. The image capturing unit 4 successively performs image capturing from the image capturing start position to the image capturing end position at the set interval (the Z interval of image capturing). The control portion 8 performs cleansing of a plurality of pieces of image data acquired by the image capturing unit 4 and detects the tip 14*e* of the upper crack. The above is the processing of Step S2.

Subsequently, it is determined whether or not the second shallowest line is in the BHC state (the crack reaching state) on the basis of the detected information (Step S3). The control portion 8 determines whether or not the line for the outward way of "Z168" is in the BHC state on the basis of the position of the tip 14e of the upper crack in the line for the outward way of "Z167" and the position of the tip 14e of the upper crack in the line for the outward way of "Z168". Specifically, when the amount of change in the position of the tip 14e of the upper crack between two lines is larger than the predetermined value, the control portion 8 determines that the line for the outward way of "Z168" is in the BHC state. The control portion 8 may derive the difference between the position of the tip 14e of the upper crack and the position where the modified region 12b is formed for the line for the outward way of "Z167" and the line for the outward way of "Z168" and may determine that the line for the outward way of "Z168" is in the BHC state when the amount of change in the difference is larger than the predetermined value.

When it is determined that the BHC state has not been realized in Step S3, the position of the tip 14e of the upper crack is detected for a line having a next shallower formation depth (a third shallowest line) (Step S4), and it is determined whether or not the third shallowest line is in the BHC state (the crack reaching state) on the basis of the position of the tip 14e of the upper crack in the second shallowest line and the position of the tip 14e of the upper crack in the third shallowest line (Step S3). In this manner, the processing of Steps S3 and S4 is repeatedly performed while gradually moving to lines having a deeper formation depth until it is determined in Step S3 that the BHC state has been realized. The processing of Steps S3 and S4 is individually performed for the outward way and the inward way. For example, after the line in the BHC state is identified for the outward way, similarly for the line for the inward way, it is also determined whether or not the BHC state has been realized in order from a line having a shallowest formation depth of the modified region 12, and the line in the BHC state is identified.

In Step S3, when the lines in the BHC state are identified for the outward and inward ways, subsequently, the control portion 8 performs determination of a pass or a fail for the length of the lower crack for each of the outward and inward ways (Step S5). Specifically, for example, the control portion 8 determines a pass or a fail for inspection by deriving the length of the lower crack using any of the expressions (1) to (3) described above and comparing the length of the lower crack to the crack length target value.

In a case where the crack length target value stipulates the lower limit for the length of the crack to be passed, when the estimated length of the lower crack is shorter than the crack length target value, the control portion 8 determines a fail for the inspection. In addition, in a case where the crack length target value stipulates the upper limit for the length of the crack to be passed, when the estimated length of the lower crack is longer than the crack length target value, the control portion 8 determines a fail for the inspection. In addition, in a case where the crack length target value stipulates the range of the length of the crack to be passed, when the estimated length of the lower crack is out of the range of the crack length target value, the control portion 8 determines a fail for the inspection. The control portion 8 may determine a pass or a fail for inspection by deriving the Z height which will be in the BHC state from the Z height corresponding to the line in the BHC state and comparing the Z height to a target Z height. In this case, the control portion 8 may determine a pass for the inspection when the derived Z height coincides with the target Z height and may determine a fail for the inspection when they do not coincide with each other. When a pass is determined for the inspection in Step S5, the inspection ends.

On the other hand, in Step S5, when a fail is determined for the inspection in at least any one of the outward and inward ways, the control portion 8 performs adjustment of the irradiation conditions (adjustment of the correction parameters) of the laser irradiation unit 3 (Step S6). Specifically, the control portion 8 derives information related to adjustment of the irradiation conditions (the correction parameters) on the basis of the estimated length of the lower crack. For example, when the length of the lower crack is short (shorter than the crack length target value stipulating the lower limit), the control portion 8 derives the correction parameters such that the length of the crack becomes longer than the crack length target value. In addition, for example, when the length of the lower crack is long (longer than the crack length target value stipulating the upper limit), the control portion 8 derives the correction parameters such that the length of the crack becomes shorter than the crack length target value. For example, information related to adjustment of the irradiation conditions (the correction parameters) is information regarding a laser and optical setting values, such as a light condensing correction amount, a processing output, and a pulse width. Further, the control portion 8 adjusts the irradiation conditions of the laser irradiation unit 3 by setting derived appropriate values for the light condensing correction amount, the processing output, the pulse width, and the like in the laser irradiation unit 3. In this manner, after the irradiation conditions are adjusted, the processing after Step S1 is executed again, and it is checked whether the length of the lower crack has become a desired length. A new modified region 12 is formed in a region of the wafer 20 where the modified region 12 is not yet formed. The above is the first inspection method. In place of the processing of Steps S2 and S3 described above, determination of the BHC state based on the presence or absence of the tip 14e of the lower crack may be performed. That is, subsequent to Step S1, determination of the BHC state based on the presence or absence of the tip 14e of the lower crack may be performed for the shallowest line, gradual movement to lines having a deeper formation depth may be made until it is determined that the BHC state has been realized, and the processing of Step S5 may be performed when it is determined that the BHC state has been realized.

In the foregoing description of the first inspection method, description has been given such that the position of the tip 14e of the upper crack is detected in Step S2 in order from a line having a shallowest formation depth and it is determined in Step S3 whether or not the BHC state has been realized, but the embodiment is not limited thereto. The position of the tip 14e of the upper crack may be detected in Step S2 in order from a line having a deepest formation depth and it may be determined in Step S3 whether or not the ST state has been realized. In this case, the processing of Steps S3 and S4 is repeatedly performed while gradually moving to lines having a shallower formation depth until it is determined in Step S3 that the ST state has been realized. Further, when it is determined that the ST state has been realized, for example, the length of the lower crack may be estimated on the basis of information of the line which has been determined to be in the BHC state last, and the processing after Step S5 may be performed.

The second inspection method illustrated in FIG. 19 is similar to the first inspection method in determining whether or not the BHC state has been realized in order from a line having a shallowest (or deepest) formation depth of the modified region 12 and performing adjustment of the irradiation conditions (adjustment of the correction parameters) but differs from the first inspection method in performing the formation processing and the determination processing for one line at a time instead of performing the determination processing after the formation processing is performed for all of the lines (however, the formation processing is performed for two lines only in the beginning). Hereinafter, points different from the first inspection method will be mainly described, and duplicate description thereof will be omitted.

In the second inspection method, first, the modified region 12 having the shallowest formation depth is formed (Step S11). That is, the modified region 12 of the line for the outward way of "Z167" illustrated in FIG. 13 is formed. Subsequently, the control portion 8 detects the position of the tip 14e of the upper crack for the line for the outward way of "Z167" which is a line having the shallowest formation depth of the modified region 12 (Step S12). Subsequently, the control portion 8 forms the modified region 12 having the second shallowest formation depth (Step S13). That is, the modified region 12 of the line for the outward way of "Z168" is formed. Subsequently, the control portion 8 detects the position of the tip 14e of the upper crack for the line for the outward way of "Z168" which is an immediately preceding line having the modified region 12 formed therein (Step S14).

Subsequently, it is determined whether or not the second shallowest line is in the BHC state (the crack reaching state) on the basis of the detected information (Step S15). The control portion 8 determines whether or not the line for the outward way of "Z168" is in the BHC state on the basis of the position of the tip 14e of the upper crack in the line for the outward way of "Z167" and the position of the tip 14e of the upper crack in the line for the outward way of "Z168". Specifically, when the amount of change in the position of the tip 14e of the upper crack between two lines is larger than the predetermined value, the control portion 8 determines that the line for the outward way of "Z168" is in the BHC state. The control portion 8 may derive the difference between the position of the tip 14e of the upper crack and the position where the modified region 12b is formed for the line for the outward way of "Z167" and the line for the outward way of "Z168" and may determine that the line for the outward way of "Z168" is in the BHC state when the amount of change in the difference is larger than the predetermined value.

when it is determined in Step S15 that the BHC state has not been realized, a modified region of a line for the outward way of "Z169" having a next shallower formation depth is formed (Step S16), and the position of the tip 14e of the upper crack is detected for the line for the outward way of "Z169" which is an immediately preceding line having the modified region 12 formed therein (Step S14). Further, it is determined whether or not the line for the outward way of "Z169" is in the BHC state (the crack reaching state) on the basis of the detected information (Step S15). In this manner, the processing of Steps S16, S14, and S15 is repeatedly performed while gradually moving to lines having a deeper formation depth until it is determined in Step S15 that the BHC state has been realized. After the line in the BHC state is identified for the line for the outward way, similarly for the line for the inward way, the line in the BHC state is also identified through the processing of Steps S11 to S15. Since the processing of Steps S17 and S18 is similar to the processing of Steps S5 and S6 described above, description thereof will be omitted. The above is the second inspection method. In place of the processing of Steps S12 to S16 described above, determination of the BHC state based on the presence or absence of the tip 14e of the lower crack may be performed. That is, subsequent to Step S11, determination of the BHC state based on the presence or absence of the tip 14e of the lower crack may be performed for the shallowest line, gradual movement to lines having a deeper formation depth may be made until it is determined that the BHC state has been realized, and the processing of Step S17 may be performed when it is determined that the BHC state has been realized.

In the third inspection method illustrated in FIG. 20, it is determined whether or not the BHC state has been realized by forming the modified region 12 at a formation depth which is assumed to be in the BHC state, adjustment of the irradiation conditions (adjustment of the correction parameters) is performed such that the lower crack is lengthened when the BHC state has not been realized. Hereinafter, points different from the first inspection method will be mainly described, and duplicate description thereof will be omitted.

In the third inspection method, first, the modified region 12 is formed at the target Z height (the Z height assumed to be in the BHC state) in order to form the modified region 12 at a formation depth assumed to be in the BHC state (Step S21). Further, it is determined whether or not the line having the modified region 12 formed therein is in the BHC state (the crack reaching state) (Step S22). For example, the control portion 8 determines whether or not the BHC state (the crack reaching state) has been realized on the basis of the presence or absence of the tip 14e of the lower crack on the front surface 21a side, which is a crack extending from the modified region 12a to the front surface 21a side.

Although the modified region 12 is formed at the formation depth assumed to be in the BHC state, when it is determined in Step S22 that the BHC state has not been realized, the control portion 8 performs adjustment of the irradiation conditions (adjustment of the correction parameters) of the laser irradiation unit 3 (Step S23). The processing of Steps S23, S21, and S22 is repeatedly performed until it is determined in Step S22 that the BHC state has been realized. When it is determined in Step S22 that the BHC state has been realized, the inspection ends. The above is the third inspection method.

In the fourth inspection method illustrated in FIG. 21, in addition to the processing of the third inspection method, reverse correction processing of shortening the length of the lower crack is performed when the length of the lower crack is excessively long. According to the third inspection method illustrated in FIG. 20, the lower crack can be made to have a desired length through adjustment of the irradiation conditions when the BHC state has not been realized in the line to be in the BHC state and the lower crack is short. However, for example, in the third inspection method, when it is determined that the BHC state has been realized without performing adjustment of the correction parameters even once, although it can be confirmed that the length of the lower crack is sufficiently long, it cannot be confirmed whether the length of the lower crack is not excessively long, and thus the length of the lower crack cannot be shortened when it is excessively long. In the fourth inspection method, when it is determined that the BHC state has been realized without performing adjustment of the correction parameters even once, it is determined whether or not the BHC state has been realized by forming the modified region at the formation depth assumed not to be in the BHC state, and adjustment of the irradiation conditions (the reverse correction processing) is performed such that the lower crack is shortened when the BHC state has been realized. Hereinafter, points different from the third inspection method will be mainly described, and duplicate description thereof will be omitted.

Steps S31 to S33 of the fourth inspection method are similar to the processing of Steps S21 to S23 of the third inspection method described above. In the fourth inspection method, when it is determined in Step S32 that the BHC state has been formed, it is determined whether or not the parameters have already been adjusted (Step S34). When adjustment of the correction parameters in Step S33 has been performed before the processing of Step S34 is performed, it is determined that the parameters have already been adjusted, and the inspection ends. On the other hand, when adjustment of the correction parameters in Step S33 has not been performed before the processing of Step S34 is performed, the modified region 12 is formed at the Z height having a shallower formation depth of the modified region 12 than the target Z height (for example, a Z height of "target Z height-1", that is, a Z height assumed not to be in the BHC state) (Step S35).

Further, it is determined whether or not the line having the modified region 12 formed therein in Step S35 is in the BHC state (the crack reaching state) (Step S36). For example, the control portion 8 determines whether or not the BHC state (the crack reaching state) has been realized on the basis of the presence or absence of the tip 14e of the lower crack on the front surface 21a side, which is a crack extending from the modified region 12a to the front surface 21a side.

Although the modified region 12 is formed at the formation depth assumed not to be in the BHC state, when it is determined in Step S36 that the BHC state has been realized, the control portion 8 performs adjustment of the irradiation conditions (adjustment of the correction parameters) of the laser irradiation unit 3 (Step S37). In this case, adjustment of the correction parameters is processing of shortening the lower crack which is excessively long and is correction processing (the reverse correction processing) performed in a direction opposite to the adjustment of the correction parameters in Step S33. The processing of Steps S37, S35, and S36 is repeatedly performed until it is determined in Step S36 that the BHC state has not been realized. When it is determined in Step S36 that the BHC state has not been realized, inspection ends. The above is the fourth inspection method.

[Screen Image when Executing Inspection of Length of Crack and Adjustment Processing]

Next, a screen image executing when inspection of a length of a crack and adjustment processing will be described with reference to FIGS. 22 to 29. The said "screen" is a screen displayed for a user when inspection of the length of a crack and the adjustment processing are executed and is a graphical user interface (GUI) screen prompting a user to perform a setting operation for inspection and displaying results of the inspection and the adjustment.

FIGS. 22 and 23 illustrate setting screens of the inspection conditions. As illustrated in FIG. 22, a display 150 (an input portion, an output portion) displays the setting screen. The display 150 has a function as an input portion for receiving an input of a user and a function as an output portion for displaying a screen with respect to a user. Specifically, the display 150 receives an input of the inspection conditions including at least information related to a thickness of a wafer and outputs a pass or a fail for inspection based on the determination results. In addition, the display 150 outputs inquiry information for inquiring regarding whether or not to perform adjustment of the irradiation conditions in the case of a fail for the inspection and receives an input of a user's request, a request of a user responding to the inquiry information. The display 150 may be a touch panel display which receives an input of a user when it is directly touched with a finger of the user or may receive an input of a user via a pointing device such as a mouse.

As illustrated in FIG. 22, the setting screen of the display 150 displays each of items such as "processing inspection conditions", "wafer thickness", "target ZH", "target length of lower end crack", "flow of BHC inspection and adjustment", "method of determining BHC", and "method of determining pass or fail". A plurality of patterns are prepared for each of the processing inspection conditions, the wafer thickness, the flow of BHC inspection and adjustment, the method of determining BHC, and the method of determining a pass or a fail, and a user can select one from a drop-down list. In the setting screen, there is a need to input at least any one of the processing inspection conditions and the wafer thickness. For example, the processing inspection conditions are conditions such as the wafer thickness (t775 μm or the like), the number of focal points (the number of SD layers, two focal points, or the like), and the inspection classification (BHC inspection or the like). For example, regarding the processing inspection conditions, a plurality of patterns of combination of conditions such as the wafer thickness, the number of focal points, and the inspection classification are prepared. The plurality of patterns of the processing inspection conditions may include patterns of various conditions which can be arbitrarily set by a user. When such processing inspection conditions are selected, as illustrated in FIG. 23, for example, a user can arbitrarily set the number of focal points, the number of passes, the processing speed, the pulse width, the frequency, the ZH, the processing output, the target length of the lower end crack, the standard thereof (the permissible range of the target length of the lower end crack), the target ZH, and the standard thereof (the permissible range of the target ZH). When a user selects ordinary processing inspection conditions (processing inspection conditions in which a user does not arbitrarily set detailed conditions), detailed SD processing conditions such as the number of passes are automatically set in accordance with the processing inspection conditions.

When at least any one of the processing inspection conditions and the wafer thickness is input, the target ZH and the target length of the lower end crack are automatically displayed (set). The target ZH is a Z height which is judged as a pass for the inspection. The target length of the lower end crack is a length of the lower crack which is judged as a pass for the inspection. A permissible range (a standard) is set to each of the target ZH and the target length of the lower end crack.

The flow of BHC inspection and adjustment is information indicating an inspection method for inspection of the length of a crack and the adjustment processing to be performed and is, for example, any of the first inspection method to the fourth inspection method described above. The method of determining BHC is information indicating a determination method for determining whether or not the BHC state has been realized and is, for example, any of determination based on the amount of change in the position of the tip of the upper crack, determination based on the amount of change in the difference between the position of the tip of the upper crack and the position where the modified region is formed, or determination based on the presence or absence of the tip of the lower crack. The method of determining a pass or a fail is information indicating a base for determining a pass or a fail for inspection, and is, for example, any of both the ZH and the length of the lower end crack, only the ZH, and only the length of the lower end crack.

FIG. 24 illustrates an example of a pass screen when Condition 1: the wafer thickness (t775 μm), the number of focal points (two focal points), and the inspection classification (BHC inspection) is selected as the processing inspection conditions, the first inspection method is selected as the flow of BHC inspection and adjustment, determination based on the amount of change in the position of the tip of the upper crack is selected as the method of determining BHC, and both the ZH and the length of the lower end crack are selected as the method of determining a pass or a fail.

As illustrated in FIG. 24, the pass screen of the display 150 shows a list in which information corresponding to setting in the setting screen is indicated on the upper left side, a result of a pass or a fail is indicated on the upper right side, the photograph of the tip position of the upper crack (SD2 crack) of the shallowest BHC line is indicated on the lower left side, inspection results (BHC margin inspection results) are indicated on the lower right side. In the BHC margin inspection results, separately for the outward way and the inward way, the rear surface state (ST or BHC), the position of the tip of the upper crack (the position of the SD2 upper end crack), the amount of change in the position of the tip of the upper crack, and the length of the lower end crack (the position of SD1 lower end) for each ZH are indicated. As shown in the BHC margin inspection results, for the outward way, the line of "Z172" in which the amount of change in the position of the tip of the upper crack has significantly changed (change of 38 μn) is determined as the shallowest BHC, and 70 μm is derived for the length of the lower end crack. Similarly, for the inward way, the line of "Z173" in which the amount of change in the position of the tip of the upper crack has significantly changed (change of 38 μm) is determined as the shallowest BHC, and 66 μm is derived for the length of the lower end crack. Currently, since the target length of the lower end crack is 65 μm±5 μm, as shown in the result of a pass or a fail, both the outward way and the inward way have passed in terms of the length of the lower end crack. In addition, since the target ZH is ZH173 (the Z height of the line of "Z173")±Z1 (an amount corresponding to one Z height), as shown in the result of a pass or a fail, both the outward way and the inward way have also passed in terms of the ZH. Below the information corresponding to setting in the setting screen, a drop-down list for setting a necessity or non-necessity for adjustment of the correction parameters is provided, and a user may request adjustment of the correction parameters from the drop-down list.

Figure 25:
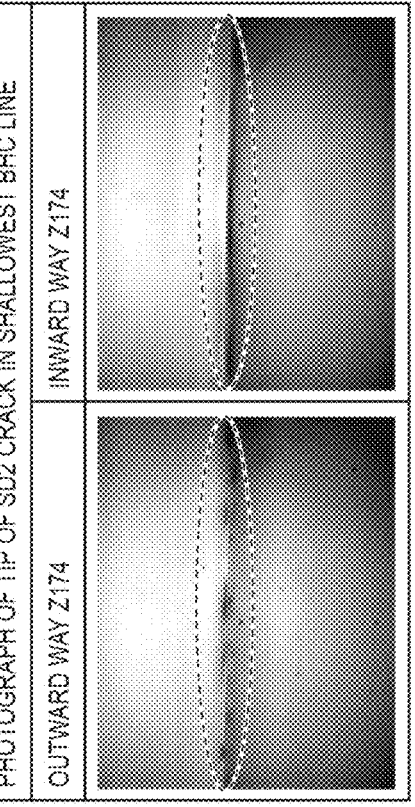
FIG. 25 is an example of an image of a failed inspection.

FIG. 25 illustrates an example of a fail screen when the processing inspection conditions, the flow of BHC inspection and adjustment, the method of determining BHC, and the method of determining a pass or a fail which are the same as those in FIG. 24 are selected. The inspection illustrated in FIG. 25 differs from the inspection illustrated in FIG. 24 in that the wafer thickness is 771 μm and the target ZH is ZH172. As shown in the BHC margin inspection results, for the outward way, the line of "Z174" in which the amount of change in the position of the tip of the upper crack has significantly changed (change of 40 μm) is determined as the shallowest BHC, and 58 μm is derived for the length of the lower end crack. Similarly, for the inward way, the line of "Z174" in which the amount of change in the position of the tip of the upper crack has significantly changed (change of 40 μm) is determined as the shallowest BHC, and 58 μm is derived for the length of the lower end crack. Currently, since the target length of the lower end crack is 65 μm±5 μm, as shown in the result of a pass or a fail, both the outward way and the inward way have failed in terms of the length of the lower end crack. In addition, since the target ZH is the ZH172 (the Z height of the line of "Z172")±Z1 (an amount corresponding to one Z height), as shown in the result of a pass or a fail, both the outward way and the inward way have also failed in terms of the ZH. When the inspection results indicate a fail, inquiry information for inquiring regarding whether or not to perform adjustment of the correction parameters (adjustment of the irradiation conditions) is displayed at the lower end portion of the fail screen of the display 150, and the display 150 receives an input of a user's request responding to the inquiry information. Further, when a user has requested in the user's request that adjustment of the irradiation conditions be performed, the control portion 8 derives information related to adjustment of the irradiation conditions and performs adjustment of the irradiation conditions.

Figure 26:
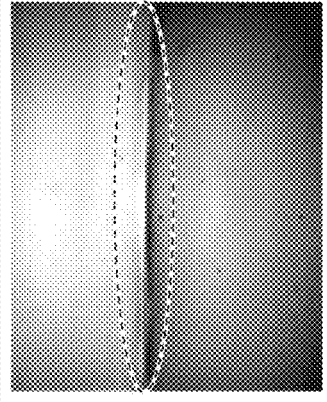
FIG. 26 is an example of an image of a passed inspection.

FIG. 26 illustrates an example of a pass screen when Condition 1: the wafer thickness (t775 μm), the number of focal points (two focal points), and the inspection classification (BHC inspection) is selected as the processing inspection conditions, the second inspection method is selected as the flow of BHC inspection and adjustment, determination based on the amount of change in the difference between the position of the tip of the upper crack and the position where the modified region is formed is selected as the method of determining BHC, and both the ZH and the length of the lower end crack are selected as the method of determining a pass or a fail. In the BHC margin inspection results, separately for the outward way and the inward way, the rear surface state (ST or BHC), a) the position of the tip of the upper crack (the position of the SD2 upper end crack), b) the position where the modified region is formed (the position of the SD1 lower end), the difference between the position of the tip of the upper crack and the position where the modified region is formed (a–b), and the amount of change in the difference for each ZH are indicated. As shown in the BHC margin inspection results, for the outward way, the line of "Z172" in which the amount of change in the difference between the position of the tip of the upper crack and the position where the modified region is formed has significantly changed (change of 42 μm) is determined as the shallowest BHC, and 70 μm is derived for the length of the lower end crack. Similarly, for the inward way, the line of "Z173" in which the amount of change in the difference between the position of the tip of the upper crack and the position where the modified region is formed has significantly changed (change of 42 μm) is determined as the shallowest BHC, and 66 μm is derived for the length of the lower end crack. Currently, since the target length of the lower end crack is 65 μm±5 μm, as shown in the result of a pass or a fail, both the outward way and the inward way have passed in terms of the length of the lower end crack. In addition, since the target ZH is the ZH173 (the Z height of the line of "Z173")±Z1 (an amount corresponding to one Z height), as shown in the result of a pass or a fail, both the outward way and the inward way have also passed in terms of the ZH.

Figure 27:
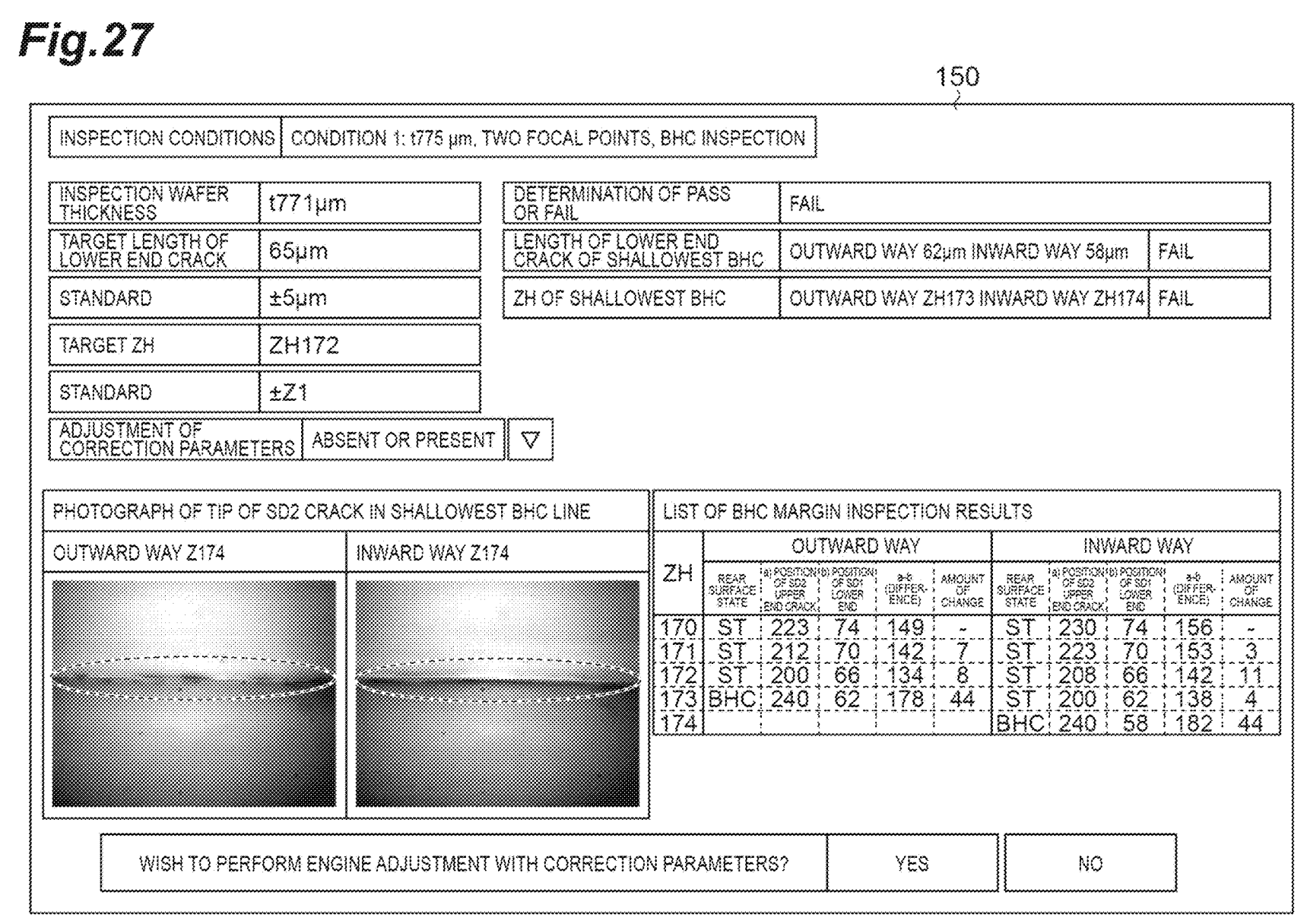

FIG. 27 illustrates an example of a fail screen when the processing inspection conditions, the flow of BHC inspection and adjustment, the method of determining BHC, and the method of determining a pass or a fail which are the same as those in FIG. 26 are selected. The inspection illustrated in FIG. 27 differs from the inspection illustrated in FIG. 26 in that the wafer thickness is 771 μm and the target ZH is the ZH172. As shown in the BHC margin inspection results, for the outward way, the line of "Z173" in which the amount of change in the difference between the position of the tip of the upper crack and the position where the modified region is formed has significantly changed (change of 44 μm) is determined as the shallowest BHC, and 62 μm is derived for the length of the lower end crack. Similarly, for the inward way, the line of "Z174" in which the amount of change in the difference between the position of the tip of the upper crack and the position where the modified region is formed has significantly changed (change of 44 μm) is determined as the shallowest BHC, and 58 μm is derived for the length of the lower end crack. Currently, since the target length of the lower end crack is 65 μm±5 μm, as shown in the result of a pass or a fail, the inward way does not satisfy the conditions so that it has failed in terms of the length of the lower end crack. In addition, since the target ZH is the ZH172 (the Z height of the line of "Z172")±Z1 (an amount corresponding to one Z height), as shown in the result of a pass or a fail, the inward way does not satisfy the conditions so that it has also failed in terms of the ZH. When the inspection results indicate a fail, inquiry information for inquiring regarding whether or not to perform adjustment of the correction parameters (adjustment of the irradiation conditions) is displayed at the lower end portion of the fail screen of the display 150.

Figure 28:
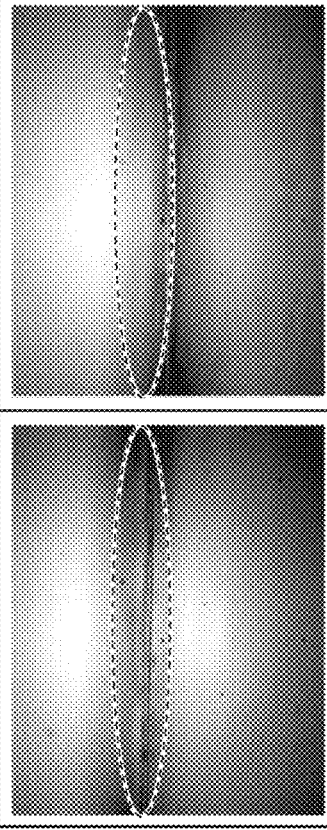
FIG. 28 is an example of an image of a passed inspection.

FIG. 28 illustrates an example of a pass screen when Condition 1: the wafer thickness (t775 μm), the number of focal points (two focal points), and the inspection classification (BHC inspection) is selected as the processing inspection conditions, the third inspection method is selected as the flow of BHC inspection and adjustment, determination based on the presence or absence of the tip of the lower crack is selected as the method of determining BHC, and both the ZH and the length of the lower end crack are selected as the method of determining a pass or a fail. In the BHC margin inspection results, separately for the outward way and the inward way, the rear surface state (ST or BHC) and the presence or absence of the tip of the lower crack for each ZH are indicated. As shown in the BHC margin inspection results, for the outward way, the line of "Z172" in which the tip of the lower crack is no longer detected is determined as the shallowest BHC, and 70 μm is derived for the length of the lower crack in accordance with the ZH. For the inward way, the line of "Z173" in which the tip of the lower crack is no longer detected is determined as the shallowest BHC, and 66 μm is derived for the length of the lower crack in accordance with the ZH. Currently, since the target length of the lower end crack is 65 μm±5 μm, as shown in the result of a pass or a fail, both the outward way and the inward way have passed in terms of the length of the lower end crack. In addition, since the target ZH is the ZH173 (the Z height of the line of "Z173")±Z1 (an amount corresponding to one Z height), as shown in the result of a pass or a fail, both the outward way and the inward way have also passed in terms of the ZH.

FIG. 29 illustrates an example of a fail screen when the processing inspection conditions, the flow of BHC inspection and adjustment, the method of determining BHC, and the method of determining a pass or a fail which are the same as those in FIG. 28 are selected. The inspection illustrated in FIG. 29 differs from the inspection illustrated in FIG. 28 in that the wafer thickness is 771 μm and the target ZH is the ZH172. As shown in the BHC margin inspection results, for the outward way, the line of "Z173" in which the tip of the lower crack is no longer detected is determined as the shallowest BHC, and 62 μm is derived for the length of the lower crack in accordance with the ZH. For the inward way, the line of "Z174" in which the tip of the lower crack is no longer detected is determined as the shallowest BHC, and 58 μm is derived for the length of the lower crack in accordance with the ZH. Currently, since the target length of the lower end crack is 65 μm±5 μm, as shown in the result of a pass or a fail, the inward way does not satisfy the conditions so that it has failed in terms of the length of the lower end crack. In addition, since the target ZH is the ZH172 (the Z height of the line of "Z172")±Z1 (an amount corresponding to one Z height), as shown in the result of a pass or a fail, the inward way does not satisfy the conditions so that it has also failed in terms of the ZH. When the inspection results indicate a fail, inquiry information for inquiring regarding whether or not to perform adjustment of the correction parameters (adjustment of the irradiation conditions) is displayed at the lower end portion of the fail screen of the display 150.

[Operational Effects]

Next, operational effects of the present embodiment will be described.

The laser processing device 1 of the present embodiment includes the stage 2 configured to support the wafer 20 having the semiconductor substrate 21 having the front surface 21a and the rear surface 21b and the functional element layer 22 formed on the front surface 21a; the laser irradiation unit 3 configured to irradiate the wafer 20 with laser light from the rear surface 21b side of the semiconductor substrate 21; the image capturing unit 4 configured to output light able to penetrate the semiconductor substrate 21 and detect light propagated through the semiconductor substrate 21; and the control portion 8 configured to execute controlling the laser irradiation unit 3 such that one or a plurality of modified regions 12 are formed inside the semiconductor substrate 21 when the wafer 20 is irradiated with laser light, determining whether or not a crack reaching state where a crack extending from the modified region 12 has reached the front surface 21a side of the semiconductor substrate 21 has been realized on the basis of a signal output from the image capturing unit 4, and deriving information related to adjustment of irradiation conditions of the laser irradiation unit 3 on the basis of determination results.

In this laser processing device 1, the wafer 20 is irradiated with laser light such that the modified region 12 is formed inside the semiconductor substrate 21, an image of light output to the semiconductor substrate 21 and able to penetrate therethrough is captured, and it is determined whether or not the crack reaching state where a crack extending from the modified region 12 has reached the front surface 21a side of the semiconductor substrate 21 has been realized on the basis of image capturing results (a signal output from the image capturing unit 4). Here, for example, it is conceivable that although the modified region 12 is formed at a position where the crack reaching state has inherently been realized (in a state where there is no problem or the like in the laser processing device 1), it be determined that the crack reaching state has not been realized (the length of a crack is shorter than the inherent length), or although the modified region 12 is formed at a position where the crack reaching state should not be realized, it be determined that the crack reaching state has been realized (the length of a crack is longer than the inherent length). In the laser processing device 1, in consideration of such determination results, information related to adjustment of the irradiation conditions of the laser irradiation unit 3 is derived. For this reason, in the laser processing device 1, for example, in consideration of the determination results, information for adjustment of the irradiation conditions can be derived such that the length of a crack is lengthened when the length of the crack is shorter than the inherent length and such that the length of a crack is shortened when the length of the crack is longer than the inherent length. Further, the length of a crack can become a desired length by adjusting the irradiation conditions using information for adjustment of the irradiation conditions which has been derived in this manner. As above, according to this laser processing device 1, the length of a crack across the modified regions 12 can become a desired length.

The control portion 8 estimates a length of a crack on the basis of the determination results and derives information related to adjustment of the irradiation conditions on the basis of the estimated length of the crack. When information related to adjustment of the irradiation conditions is derived on the basis of the estimated length of the crack, adjustment accuracy of the irradiation conditions is improved, and the length of a crack can become a desired length with higher accuracy.

The laser processing device 1 has the display 150 related to a user's operation. The display 150 receives an input of inspection conditions including at least information related to the thickness of the wafer 20 and outputs a pass or a fail for inspection based on the determination results. Further, the control portion 8 compares the crack length target value, a target value for the crack length set in accordance with the inspection conditions, to the estimated length of the crack, and when it is decided that adjustment of the irradiation conditions is required, the control portion 8 decides a fail for the inspection. In this manner, when the crack length target value is derived on the basis of information related to the thickness of the wafer 20 input from a user and a necessity or non-necessity for adjustment of the irradiation conditions (a pass or a fail for inspection) is decided, the length of a crack can be more suitably adjusted in consideration of the inspection conditions (information related to the thickness of the wafer 20). In addition, when a pass or a fail for inspection is output, a user can be informed of the state of the length of a crack.

The display 150 outputs inquiry information for inquiring regarding whether or not to perform adjustment of the irradiation conditions in the case of a fail for the inspection, and receives an input of a user's request, a request of a user responding to the inquiry information. The control portion 8 derives information related to adjustment of the irradiation conditions when the user has requested in the user's request that adjustment of the irradiation conditions be performed. Accordingly, the length of a crack can be adjusted reflecting a demand of a user.

The control portion 8 adjusts the irradiation conditions on the basis of the derived information related to adjustment. In this case, since the irradiation conditions are automatically adjusted, the length of a crack can become a desired length more simply and promptly.

The control portion 8 controls the laser irradiation unit 3 such that the modified region 12 having a formation depth different from formation depths of other lines included in a plurality of lines is formed along each of the plurality of lines in the wafer 20, and derives the difference between the position of the tip 14e of the upper crack on the rear surface 21b side, which is a crack extending from the modified region 12 to the rear surface 21b side of the semiconductor substrate 21, and the position where the modified region 12 is formed in order from a line having a shallowest formation depth of the modified region 12 or in order from a line having a deepest formation depth of the modified region 12, and determines whether or not the crack reaching state has been realized on the basis of the amount of change in the difference. If the difference between the position of the tip 14e of the upper crack on the rear surface 21b side and the position where the modified region 12 is formed is derived in order from a line having a shallowest formation depth of the modified region 12 or in order from a line having a deepest formation depth thereof, the amount of change in the difference described above from the immediately preceding line becomes large in a line changing between the crack reaching state and a state where a crack has not reached the front surface 21a side of the semiconductor substrate 21. For this reason, it is possible to determine with high accuracy whether or not the crack reaching state has been realized by determining whether or not the crack reaching state has been realized on the basis of the amount of change in the difference described above.

The control portion 8 controls the laser irradiation unit 3 such that the modified region 12 having a formation depth different from formation depths of other lines included in a plurality of lines is formed along each of the plurality of lines in the wafer 20, and derives the position of the tip 14e of the upper crack on the rear surface 21b side, which is a crack extending from the modified region 12 to the rear surface 21b side of the semiconductor substrate 21, in order from a line having a shallowest formation depth of the modified region 12 or in order from a line having a deepest formation depth of the modified region 12, and determines whether or not the crack reaching state has been realized on the basis of the amount of change in the position of the tip 14e. If the position of the tip 14e of the upper crack on the rear surface 21b side is derived in order from a line having a shallowest formation depth of the modified region or in order from a line having a deepest formation depth thereof, the amount of change in the position of the tip 14e described above from the immediately preceding line becomes large in a line changing between the crack reaching state and a state where a crack has not reached the front surface 21a side of the semiconductor substrate 21. For this reason, it is possible to determine with high accuracy whether or not the crack reaching state has been realized by determining whether or not the crack reaching state has been realized on the basis of the amount of change in the position of the tip 14e described above.

The control portion 8 determines whether or not the crack reaching state has been realized on the basis of the presence or absence of the tip 14e of the lower crack on the front surface 21a side, which is a crack extending from the modified region 12 to the front surface 21a side of the semiconductor substrate 21. When the presence of the tip 14e of the lower crack on the front surface 21a side is confirmed, it is assumed that the crack is not in the crack reaching state. For this reason, it is possible to determine with high accuracy whether or not the crack reaching state has been realized by determining whether or not the crack reaching state has been realized on the basis of the presence or absence of the tip 14e of the lower crack on the front surface 21a side.

The control portion 8 controls the laser irradiation unit 3 such that the modified region 12 is formed at a predetermined first formation depth having been estimated to be in the crack reaching state in advance, and when it is determined that a crack extending from the modified region 12 is not in the crack reaching state, the control portion 8 derives information related to adjustment of the irradiation conditions such that the length of a crack is lengthened. In this manner, when information related to adjustment of the irradiation conditions is derived such that the length of a crack is lengthened when the modified region 12 has been formed at a formation depth having been estimated to be in the crack reaching state and the crack reaching state has not been realized, inspection can be promptly performed with minimum necessary formation or the like of the modified region 12 related to inspection.

The control portion 8 controls the laser irradiation unit 3 such that the modified region 12 is formed at a predetermined second formation depth having been estimated not to be in the crack reaching state when it is determined that the modified region 12 has been formed at the first formation depth and the crack reaching state has been realized in a state where adjustment of the irradiation conditions has not been performed, and the control portion 8 derives information related to adjustment of the irradiation conditions such that the length of a crack is shortened when it is determined that the crack reaching state has been realized. When it is determined that the crack reaching state has been realized at the first formation depth without performing adjustment of the irradiation conditions even once, although it is guaranteed that the length of the crack is sufficiently long when the modified region 12 is formed at a depth at which the crack reaching state should have been realized (the first formation depth), it is not guaranteed that the length of the crack is not excessively long (not longer than a desired length of the crack). In this regard, when the crack reaching state has been realized at the first formation depth, it is determined whether or not the modified region has been formed at the second formation depth having been estimated not to be in the crack reaching state and the crack reaching state has not been realized, and when the crack reaching state has been realized, and when the crack reaching state has been realized, information related to adjustment of the irradiation conditions is derived such that the length of a crack is shortened. Therefore, when the length of a crack has become longer than a desired length, the length of the crack can be suitably shortened (to a desired length).

Hereinabove, the present embodiment has been described, but the present invention is not limited to the foregoing embodiment. For example, description has been given such that the control portion 8 adjusts the irradiation conditions on the basis of the derived information related to adjustment, but the embodiment is not limited thereto. After the control portion 8 derives information related to adjustment, the output portion (the display 150 or the like) may output information related to adjustment derived by the control portion 8. In this case, on the basis of the output information related to adjustment, for example, the irradiation conditions can be adjusted while being manually checked by a user, and the length of a crack can become a desired length.

REFERENCE SIGNS LIST

1 Laser processing device (inspection device)
2 Stage
3 Laser irradiation unit (laser irradiation portion)
4 Image capturing unit (image capturing portion)
8 Control unit
12 Modified region
14 Crack
20 Wafer
21 Semiconductor substrate
21a Front surface
21b Rear surface
22 Functional element layer
150 Display (input portion, output portion)

The invention claimed is:

1. An inspection device comprising:
    a stage configured to support a wafer having a semiconductor substrate having a first front surface and a second front surface;
    a laser irradiation portion configured to irradiate the wafer with laser light;
    an image capturing portion configured to output light able to penetrate the semiconductor substrate and detect the light propagated through the semiconductor substrate; and
    a control portion configured to execute controlling the laser irradiation portion such that one or a plurality of modified regions are formed inside the semiconductor substrate when the wafer is irradiated with the laser light, controlling the image capturing portion such that the light is constantly detected and a plurality of images are acquired while a focal point is moved in a vertical direction, determining whether or not a crack reaching state where a crack extending from the modified region has reached the first front surface side of the semiconductor substrate has been realized on the basis of a signal output from the image capturing portion having detected the light, and deriving information related to adjustment of irradiation conditions of the laser irradiation portion on the basis of determination results,
    wherein the control portion controls the image capturing portion such that a section between at least the first front surface and a virtual image region of a lower crack being the crack extending from the modified region to the first front region acts as an image capturing section, and
    wherein the control portion determines whether or not the crack reaching state has been realized on the basis of the presence or absence of a tip of a lower crack on the first front surface side, which is a crack extending from the modified region to the first front surface side of the semiconductor substrate, and when the presence of the tip of the lower crack is confirmed, it is assumed that the crack is not in the crack reaching state.

2. The inspection device according to claim 1,
    wherein the control portion estimates a length of the crack on the basis of the determination results and derives information related to adjustment of the irradiation conditions on the basis of the estimated length of the crack.

3. The inspection device according to claim 2 further comprising:
    an input portion configured to receive an input of inspection conditions including at least information related to a thickness of the wafer; and
    an output portion configured to output a pass or a fail for inspection based on the determination results,
    wherein the control portion compares a crack length target value, a target value for the crack length set in accordance with the inspection conditions, to the estimated length of the crack, and when it is decided that adjustment of the irradiation conditions is required, the control portion decides a fail for the inspection.

4. The inspection device according to claim 3,
    wherein the output portion outputs inquiry information for inquiring regarding whether or not to perform adjustment of the irradiation conditions in the case of a fail for the inspection, wherein the input portion receives an input of a user's request, a request of a user responding to the inquiry information, and wherein the control portion derives information related to adjustment of the irradiation conditions when the user has requested in the user's request that adjustment of the irradiation conditions be performed.

5. The inspection device according to claim 4,
wherein the output portion outputs information related to the adjustment derived by the control portion.

6. The inspection device according to claim 1,
wherein the control portion adjusts the irradiation conditions on the basis of the derived information related to the adjustment.

7. The inspection device according to claim 1,
wherein the control portion
controls the laser irradiation portion such that the modified region having a formation depth different from formation depths of other lines included in a plurality of lines is formed along each of the plurality of lines in the wafer, and
derives a difference between a position of a tip of an upper crack on the second front surface side, which is a crack extending from the modified region to the second front surface side of the semiconductor substrate, and a position where the modified region is formed in order from a line having a shallowest formation depth of the modified region or in order from a line having a deepest formation depth of the modified region, and determines whether or not the crack reaching state has been realized on the basis of an amount of change in the difference.

8. The inspection device according to claim 1,
wherein the control portion
controls the laser irradiation portion such that the modified region having a formation depth different from formation depths of other lines included in a plurality of lines is formed along each of the plurality of lines in the wafer, and
derives a position of a tip of an upper crack on the second front surface side, which is a crack extending from the modified region to the second front surface side of the semiconductor substrate, in order from a line having a shallowest formation depth of the modified region or in order from a line having a deepest formation depth of the modified region, and determines whether or not the crack reaching state has been realized on the basis of an amount of change in the position of the tip.

9. The inspection device according to claim 1,
wherein the control portion controls the laser irradiation portion such that the modified region is formed at a predetermined first formation depth having been estimated to be in the crack reaching state in advance, and when it is determined that a crack extending from the modified region is not in the crack reaching state, the control portion derives information related to adjustment of the irradiation conditions such that a length of the crack is lengthened.

10. The inspection device according to claim 9,
wherein the control portion controls the laser irradiation portion such that the modified region is formed at a predetermined second formation depth having been estimated not to be in the crack reaching state when it is determined that the modified region has been formed at the first formation depth and the crack reaching state has been realized in a state where adjustment of the irradiation conditions has not been performed, and the control portion derives information related to adjustment of the irradiation conditions such that a length of the crack is shortened when it is determined that the crack reaching state has been realized.

11. An inspection method comprising:
a first step of preparing a wafer including a semiconductor substrate having a first front surface and a second front surface and forming one or a plurality of modified regions inside the semiconductor substrate by irradiating the wafer with laser light;
a second step of outputting light able to penetrate the semiconductor substrate having the modified region formed therein by the first step, constantly detecting the light propagated through the semiconductor substrate, and acquiring a plurality of images while a focal point is moved in a vertical direction;
a third step of determining whether or not a crack reaching state where a crack extending from the modified region has reached the first front surface side of the semiconductor substrate has been realized on the basis of the light detected in the second step; and
a fourth step of deriving information related to adjustment of irradiation conditions of the laser light on the basis of determination results in the third step,
wherein a section between at least the first front surface and a virtual image region of a lower crack being the crack extending from the modified region to the first front region acts as an image capturing section, and
wherein the determining whether or not the crack reaching state has been realized is on the basis of the presence or absence of a tip of a lower crack on the first front surface side, which is a crack extending from the modified region to the first front surface side of the semiconductor substrate, and when the presence of the tip of the lower crack is confirmed, it is assumed that the crack is not in the crack reaching state.

* * * * *